(12) United States Patent
Wang et al.

(10) Patent No.: US 11,587,791 B2
(45) Date of Patent: Feb. 21, 2023

(54) SILICON INTERMIXING LAYER FOR BLOCKING DIFFUSION

(71) Applicant: Taiwan Semiconductor Manufacturing Company, Ltd., Hsinchu (TW)

(72) Inventors: Chun-Chieh Wang, Kaohsiung (TW); Kuo-Jung Huang, Hsinchu (TW); Yueh-Ching Pai, Taichung (TW); Huai-Tei Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 65 days.

(21) Appl. No.: 16/290,118

(22) Filed: Mar. 1, 2019

(65) Prior Publication Data
US 2020/0126797 A1 Apr. 23, 2020

Related U.S. Application Data

(60) Provisional application No. 62/749,195, filed on Oct. 23, 2018.

(51) Int. Cl.
| | | |
|---|---|---|
| *H01L 21/28* | (2006.01) | |
| *H01L 21/768* | (2006.01) | |
| *H01L 21/02* | (2006.01) | |
| *H01L 27/088* | (2006.01) | |
| *H01L 29/78* | (2006.01) | |
| *H01L 29/66* | (2006.01) | |
| *H01L 21/8234* | (2006.01) | |

(Continued)

(52) U.S. Cl.
CPC .... *H01L 21/28088* (2013.01); *H01L 21/0228* (2013.01); *H01L 21/28194* (2013.01); *H01L 21/3086* (2013.01); *H01L 21/76829* (2013.01); *H01L 21/823431* (2013.01); *H01L 21/823437* (2013.01); *H01L 21/823468* (2013.01); *H01L 27/0886* (2013.01); *H01L 29/4966* (2013.01); *H01L 29/66545* (2013.01); *H01L 29/66795* (2013.01); *H01L 29/7851* (2013.01)

(58) Field of Classification Search
CPC .......... H01L 21/28088; H01L 21/0228; H01L 21/28194; H01L 21/3086; H01L 21/76829; H01L 21/823431; H01L 21/823437; H01L 21/823468; H01L 27/0886
USPC ....................................................... 257/368
See application file for complete search history.

(56) References Cited

U.S. PATENT DOCUMENTS

| | | |
|---|---|---|
| 9,059,142 B2 | 6/2015 | Liang et al. |
| 10,755,938 B2 | 8/2020 | Hung et al. |

(Continued)

FOREIGN PATENT DOCUMENTS

| | | |
|---|---|---|
| CN | 103579006 A | 2/2014 |
| CN | 105810735 A | 7/2016 |

(Continued)

*Primary Examiner* — Ori Nadav
(74) *Attorney, Agent, or Firm* — Slater Matsil, LLP

(57) ABSTRACT

A method of forming an integrated circuit structure includes forming a gate dielectric on a wafer, forming a work function layer over the gate dielectric, depositing a capping layer over the work function layer, soaking the capping layer in a silicon-containing gas to form a silicon-containing layer, forming a blocking layer after the silicon-containing layer is formed, and forming a metal-filling region over the blocking layer.

19 Claims, 27 Drawing Sheets

(51) Int. Cl.
  *H01L 21/308*  (2006.01)
  *H01L 29/49*  (2006.01)

(56) References Cited

U.S. PATENT DOCUMENTS

| | | | |
|---|---|---|---|
| 10,818,767 B2 | 10/2020 | Tsau | |
| 10,868,138 B2 | 12/2020 | Chang et al. | |
| 11,195,931 B2 | 12/2021 | Tsai et al. | |
| 2004/0087136 A1* | 5/2004 | Wu | H01L 21/76843 |
| | | | 438/629 |
| 2009/0203176 A1* | 8/2009 | Kakehata | H01L 29/78603 |
| | | | 438/164 |
| 2010/0052079 A1 | 3/2010 | Hirano et al. | |
| 2011/0244673 A1* | 10/2011 | Cho | H01L 29/4966 |
| | | | 438/589 |
| 2013/0026578 A1 | 1/2013 | Tsau | |
| 2014/0021535 A1* | 1/2014 | Liang | H01L 29/4236 |
| | | | 257/330 |
| 2014/0239419 A1 | 8/2014 | Chen et al. | |
| 2015/0325662 A1 | 11/2015 | Wang et al. | |
| 2016/0027639 A1* | 1/2016 | Hou | H01L 21/76856 |
| | | | 438/653 |
| 2016/0079070 A1 | 3/2016 | Ogawa et al. | |
| 2016/0211339 A1* | 7/2016 | Hung | C23C 14/025 |
| 2016/0254385 A1 | 9/2016 | Wen et al. | |
| 2016/0351413 A1* | 12/2016 | Schmidt | H01L 21/02315 |
| 2020/0105895 A1* | 4/2020 | Tang | H01L 21/28088 |

FOREIGN PATENT DOCUMENTS

| | | |
|---|---|---|
| CN | 107017290 A | 8/2017 |
| CN | 107689396 A | 2/2018 |
| CN | 107993933 A | 5/2018 |
| TW | 201631766 A | 9/2016 |
| WO | 2015047731 A1 | 4/2015 |

\* cited by examiner

SILICON INTERMIXING LAYER FOR BLOCKING DIFFUSION

PRIORITY CLAIM AND CROSS-REFERENCE

This application claims the benefit of the following provisionally filed U.S. patent application: Application Ser. No. 62/749,195, filed Oct. 23, 2018, and entitled "Silicon Intermixing Layer for Blocking Diffusion;" which application is hereby incorporated herein by reference.

BACKGROUND

Metal-Oxide-Semiconductor (MOS) devices are basic building elements in integrated circuits. An existing MOS device typically has a gate electrode formed of polysilicon doped with p-type or n-type impurities, using doping operations such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to meet the requirements of the NMOS devices and PMOS devices.

The formation of metal gates typically involves depositing metal layers and then performing Chemical Mechanical Polish (CMP) to remove excess portions of the metal layers. The remaining portions of the metal layers form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
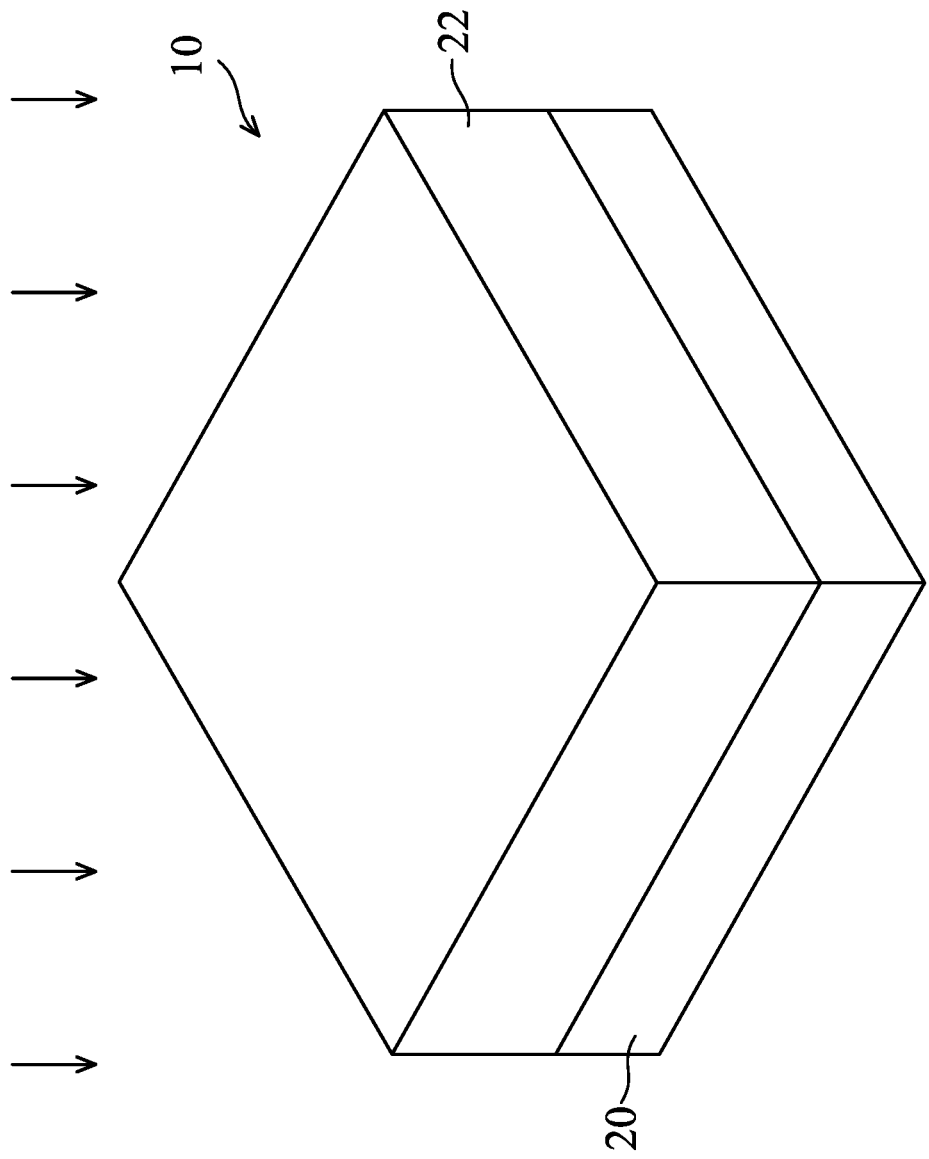
FIGS. 1-6, 7A, 7B, 8, 9A, 9B, 16, and 17 illustrate the perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with replacement gates and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In the illustrated embodiments, the formation of Fin Field-Effect Transistors (FinFETs) is used as an example to explain the concept of the present disclosure. Planar transistors may also adopt the concept of the present disclosure. In accordance with some embodiments of the present disclosure, a silicon-containing soaking (treatment) process is performed after the formation of a work function layer and a metal capping layer, and before the filling metal of the metal gate is deposited. Furthermore, the silicon-containing soaking process may be performed after a TiCl$_4$ pulsing and purging process to improve the efficiency of the soaking process. The silicon-containing intermixing layers resulted from the silicon-containing soaking process has the function of preventing the metal in the work function layer from diffusing upwardly to adversely affect the work function, and preventing oxygen from diffusing downwardly into the work function layer.

FIGS. 1-6, 7A, 7B, 8, 9A, 9B, 16, and 17 illustrate the cross-sectional views and perspective views of intermediate stages in the formation of a Fin Field-Effect Transistor (FinFET) in accordance with some embodiments of the present disclosure. The processes shown in these figures are also reflected schematically in the process flow 200 shown in FIG. 24.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 24. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
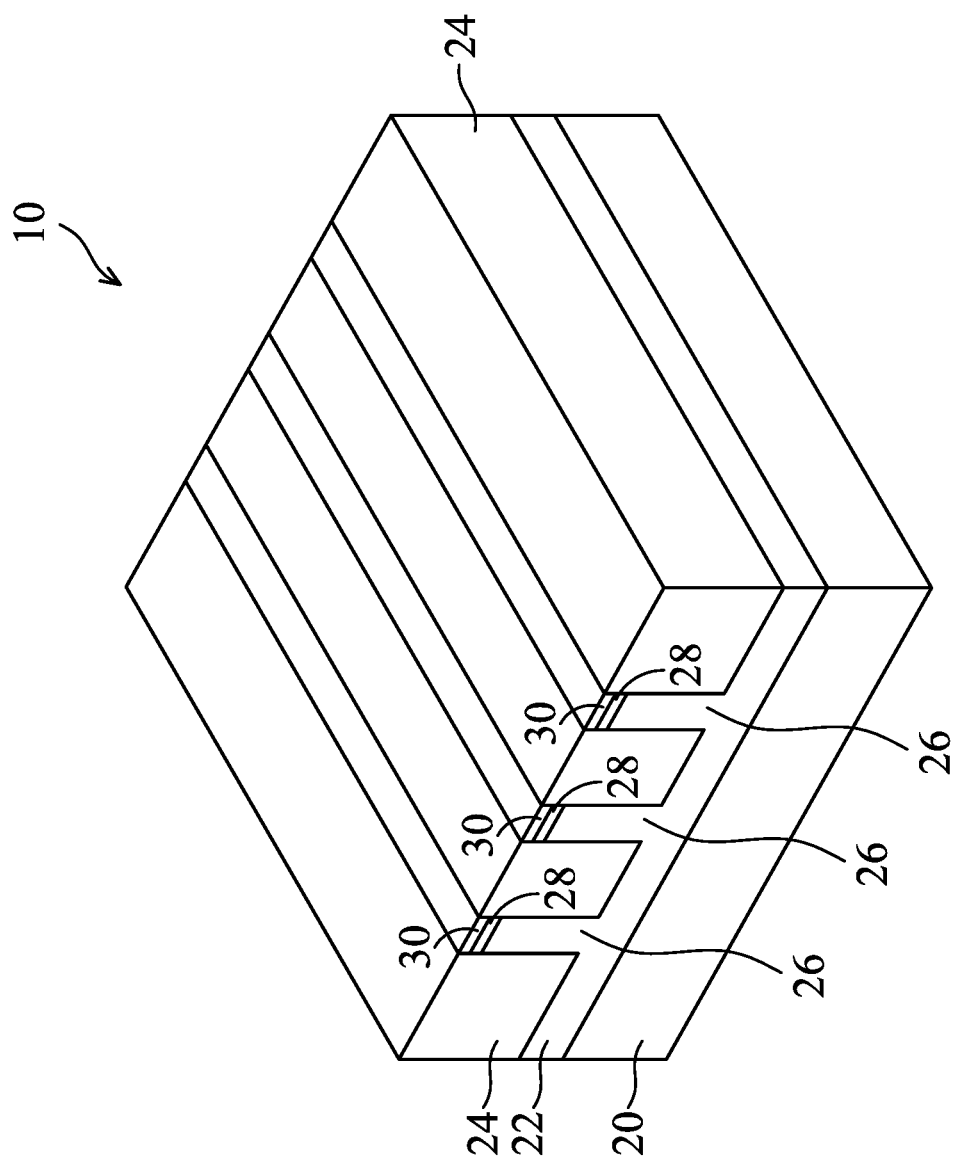

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 shown in FIG. 24. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard mask layer 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
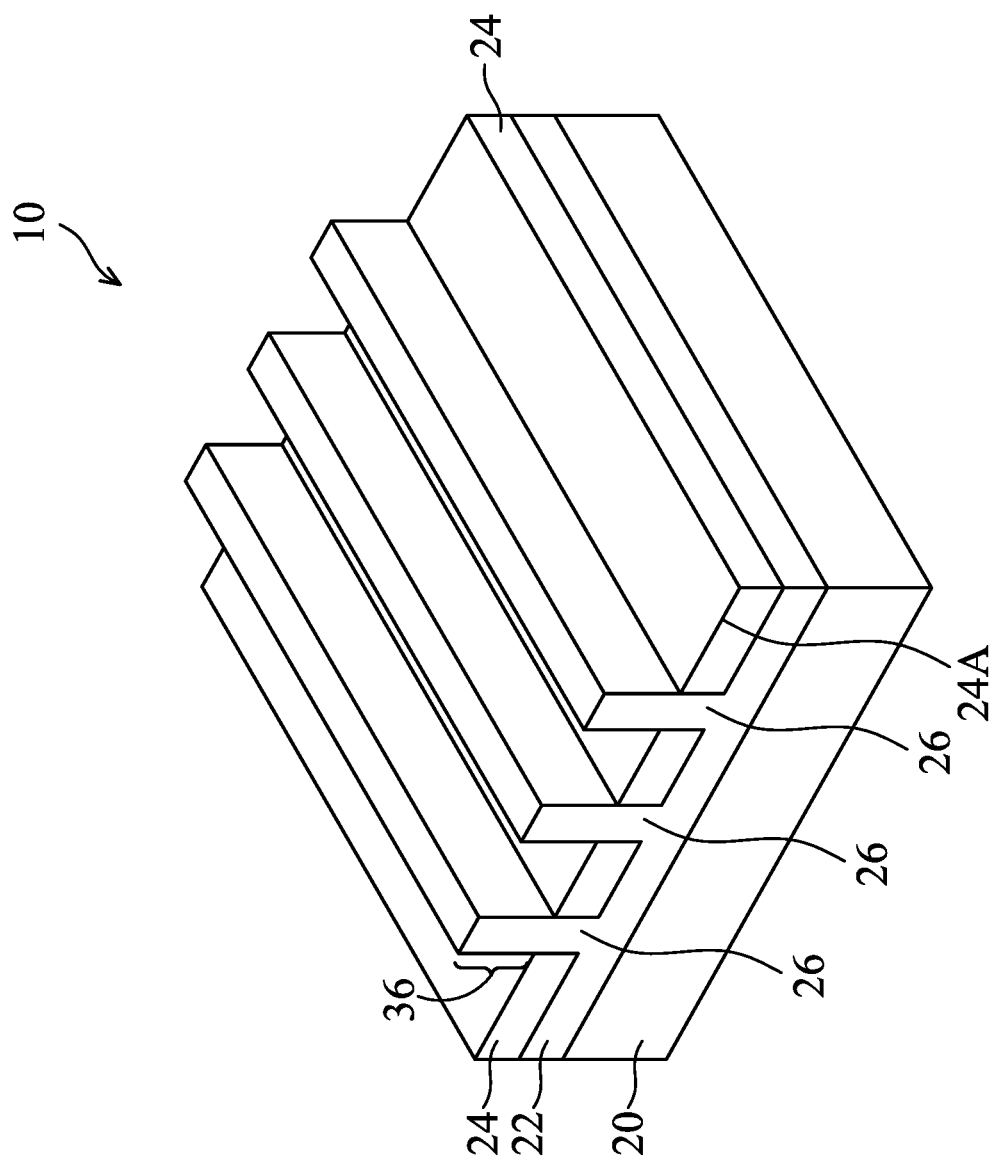

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 shown in FIG. 24. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
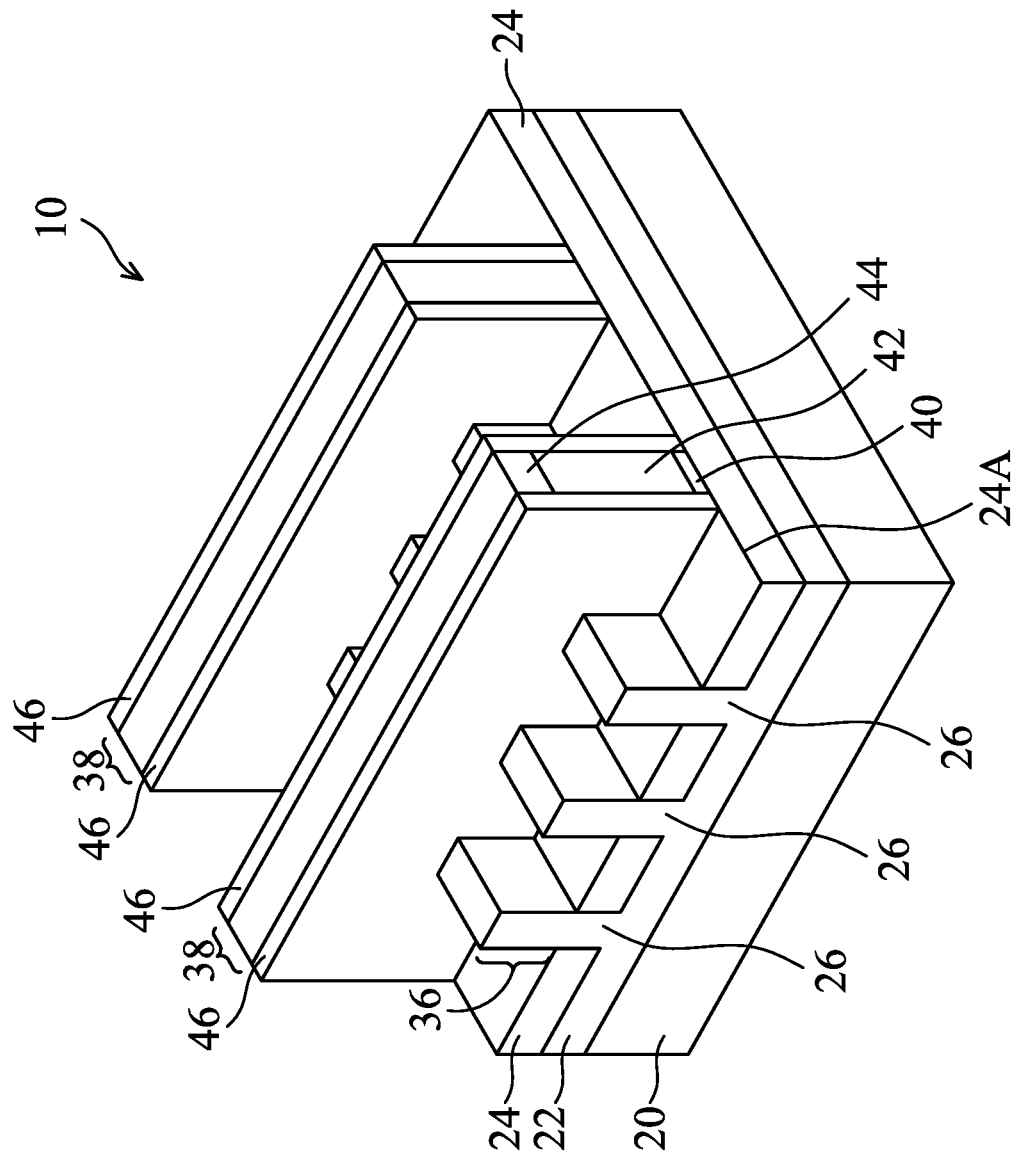

Referring to FIG. 4, dummy gate stacks 38 are formed to extend on the top surfaces and the sidewalls of (protruding) fins 36. The respective process is illustrated as process 208 in the process flow 200 shown in FIG. 24. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 shown in FIG. 24. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
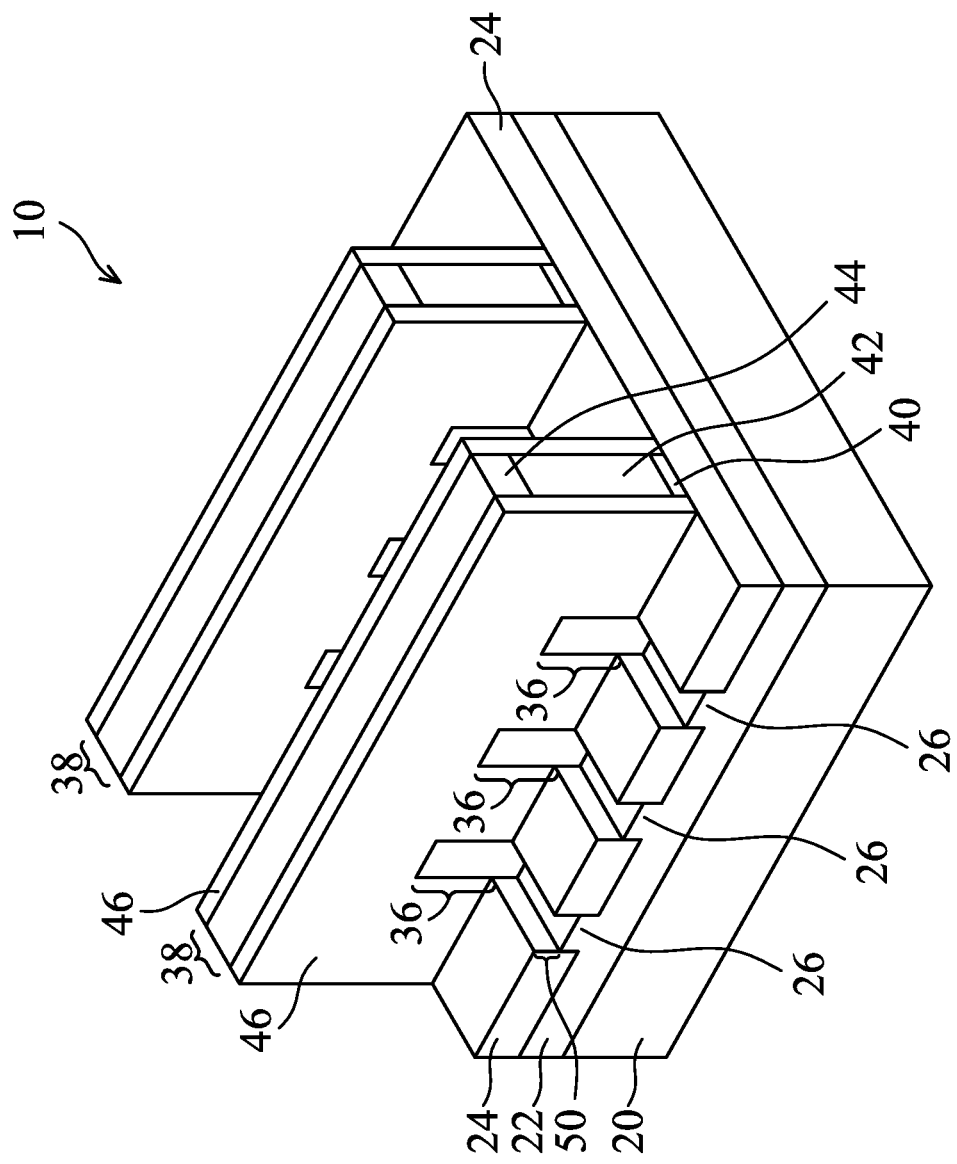

An etching process is then performed to etch the portions of protruding fins 36 that are not covered by dummy gate stacks 38 and gate spacers 46, resulting in the structure shown in FIG. 5. The respective process is illustrated as process 210 in the process flow 200 shown in FIG. 24. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
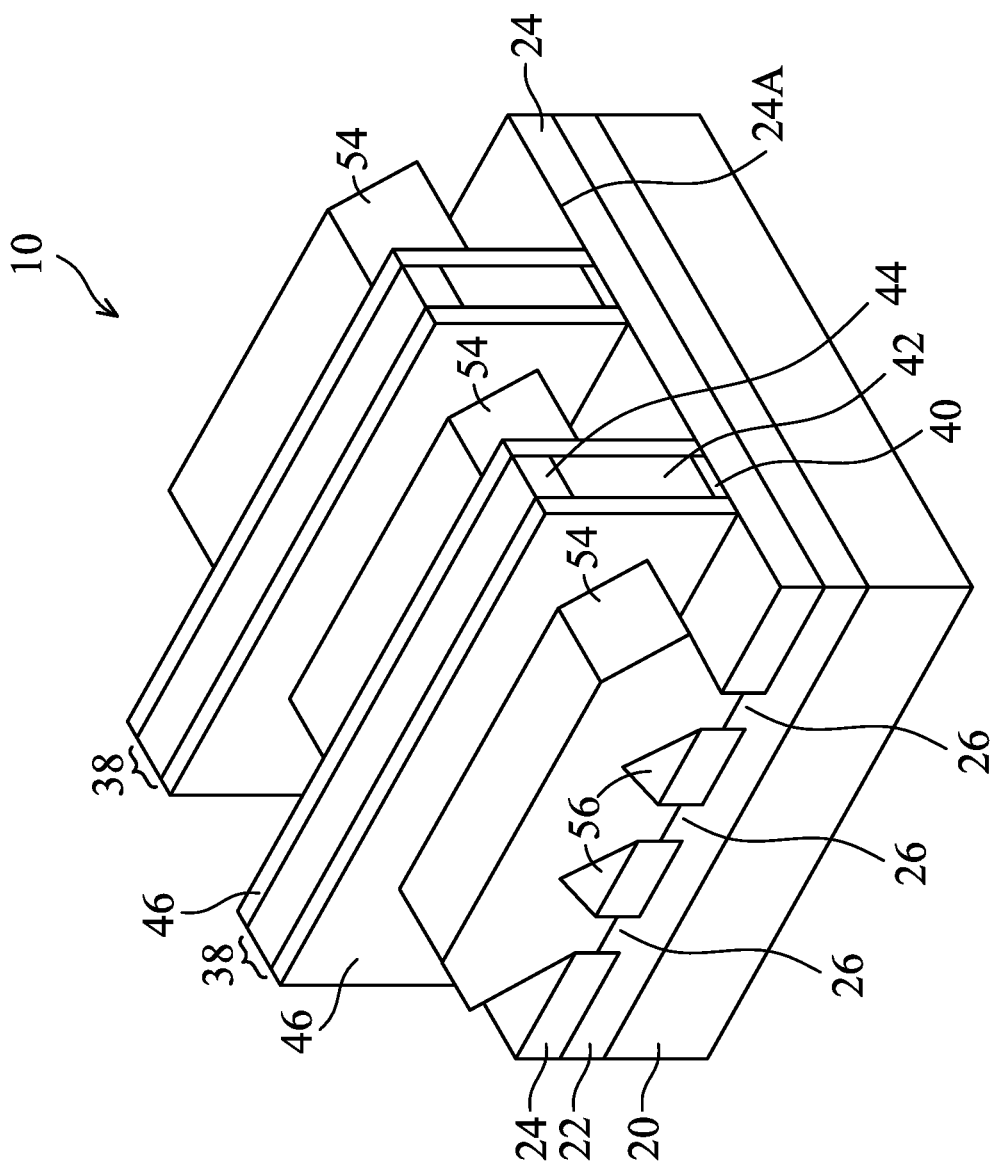

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 shown in FIG. 24. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
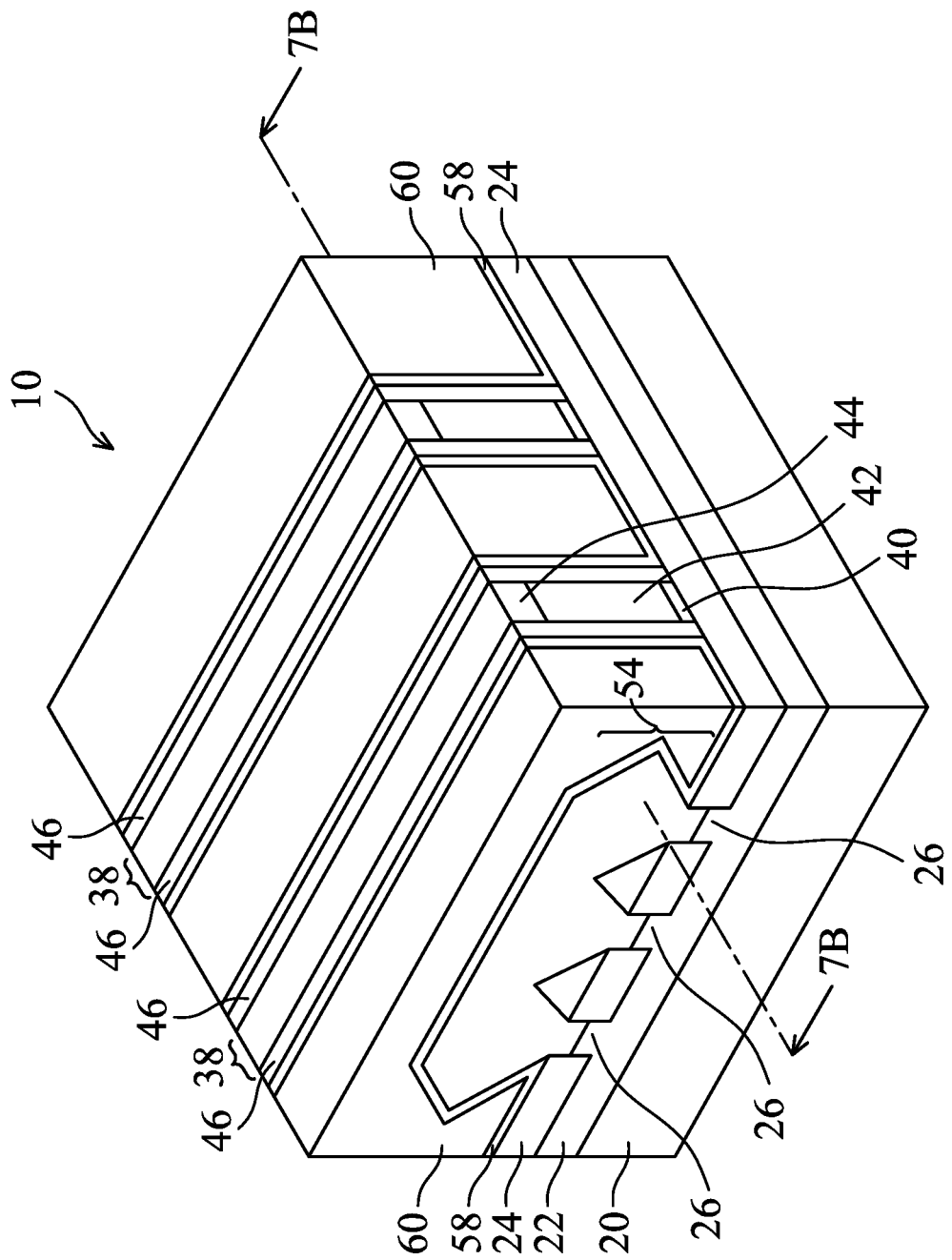

FIG. 7A illustrates a perspective view of the structure after the formation of Contact Etch Stop Layer (CESL) 58 and Inter-Layer Dielectric (ILD) 60. The respective process is illustrated as process 214 in the process flow 200 shown in FIG. 24. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
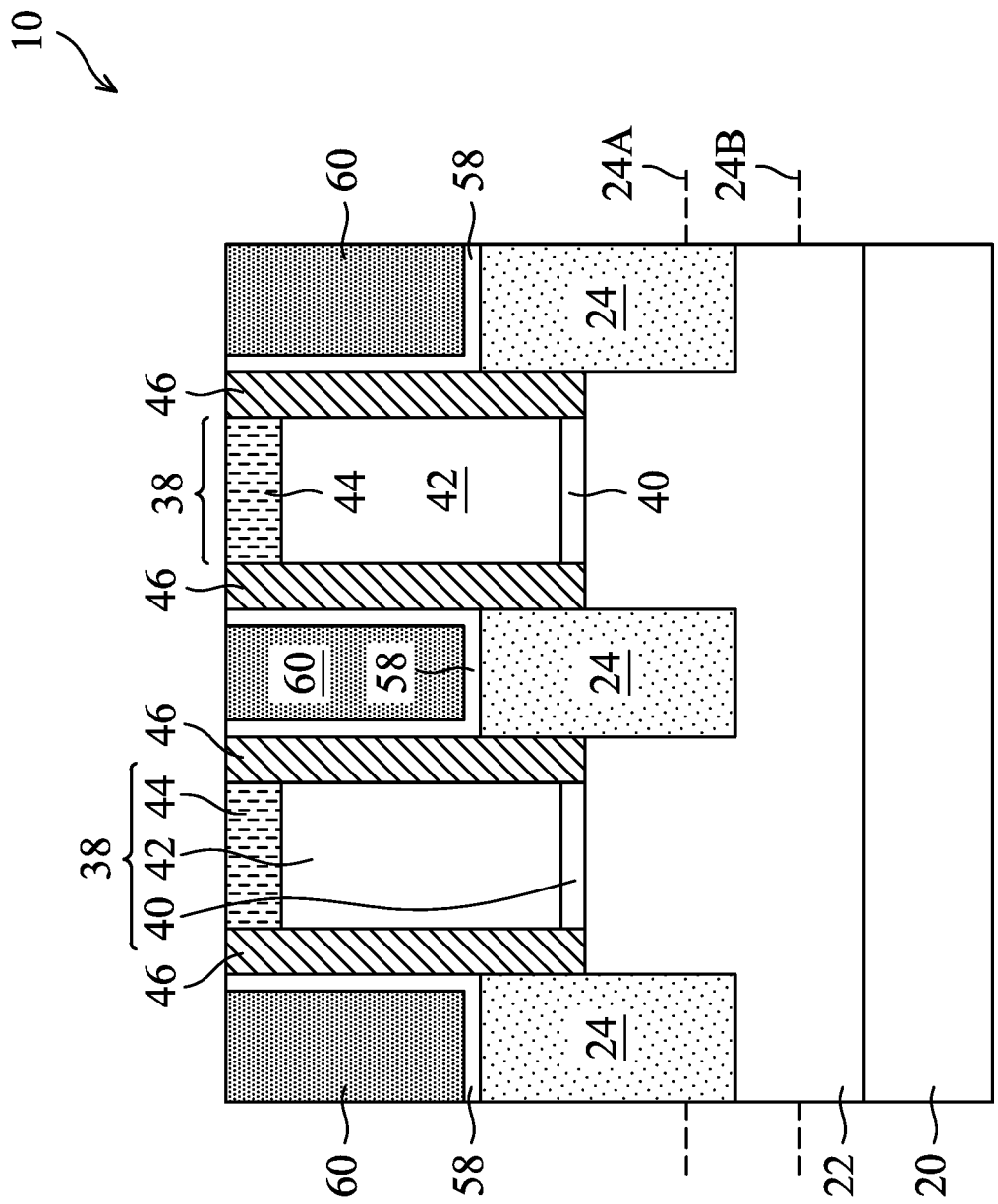
Figure 8:
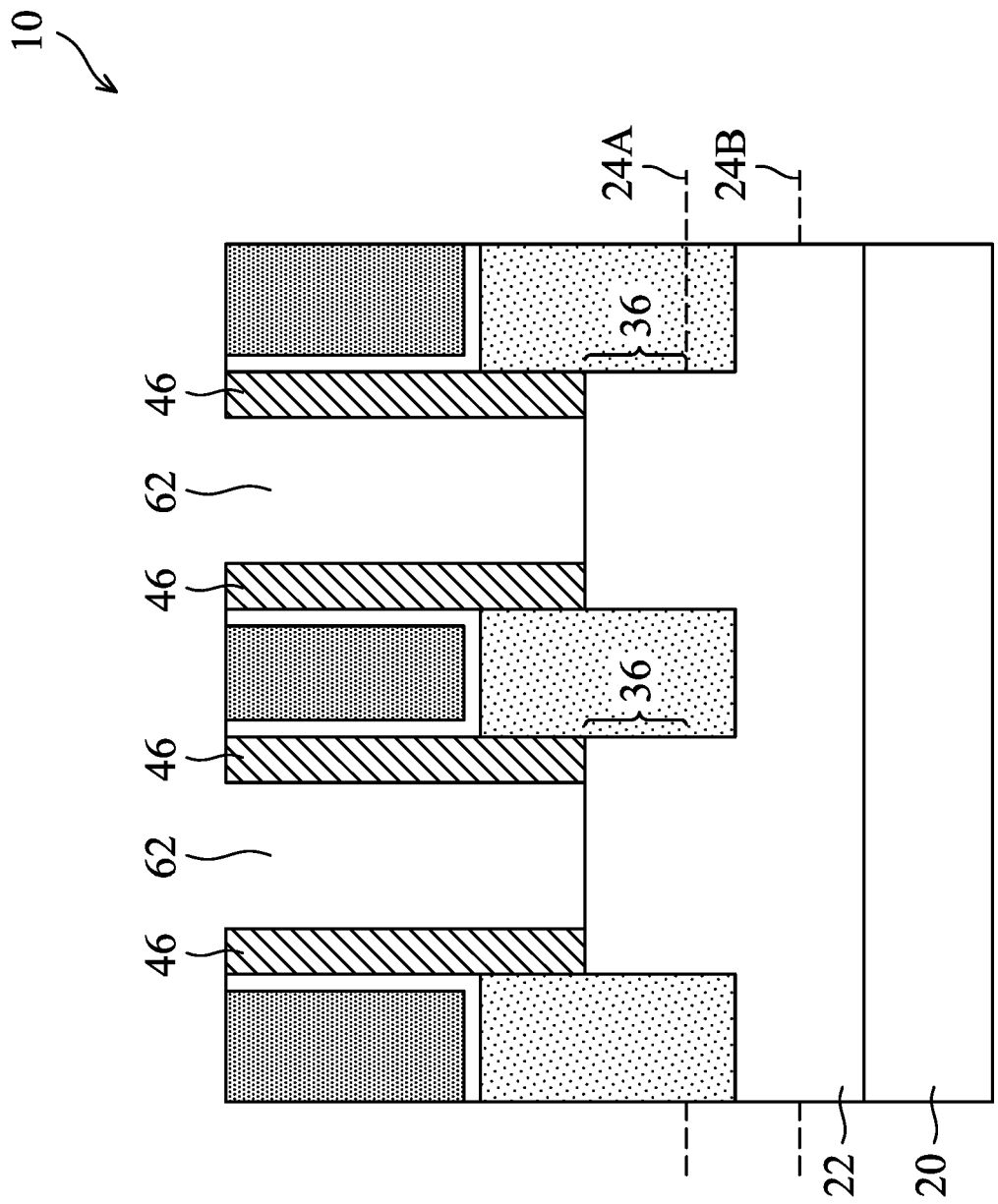
Figure 9A:
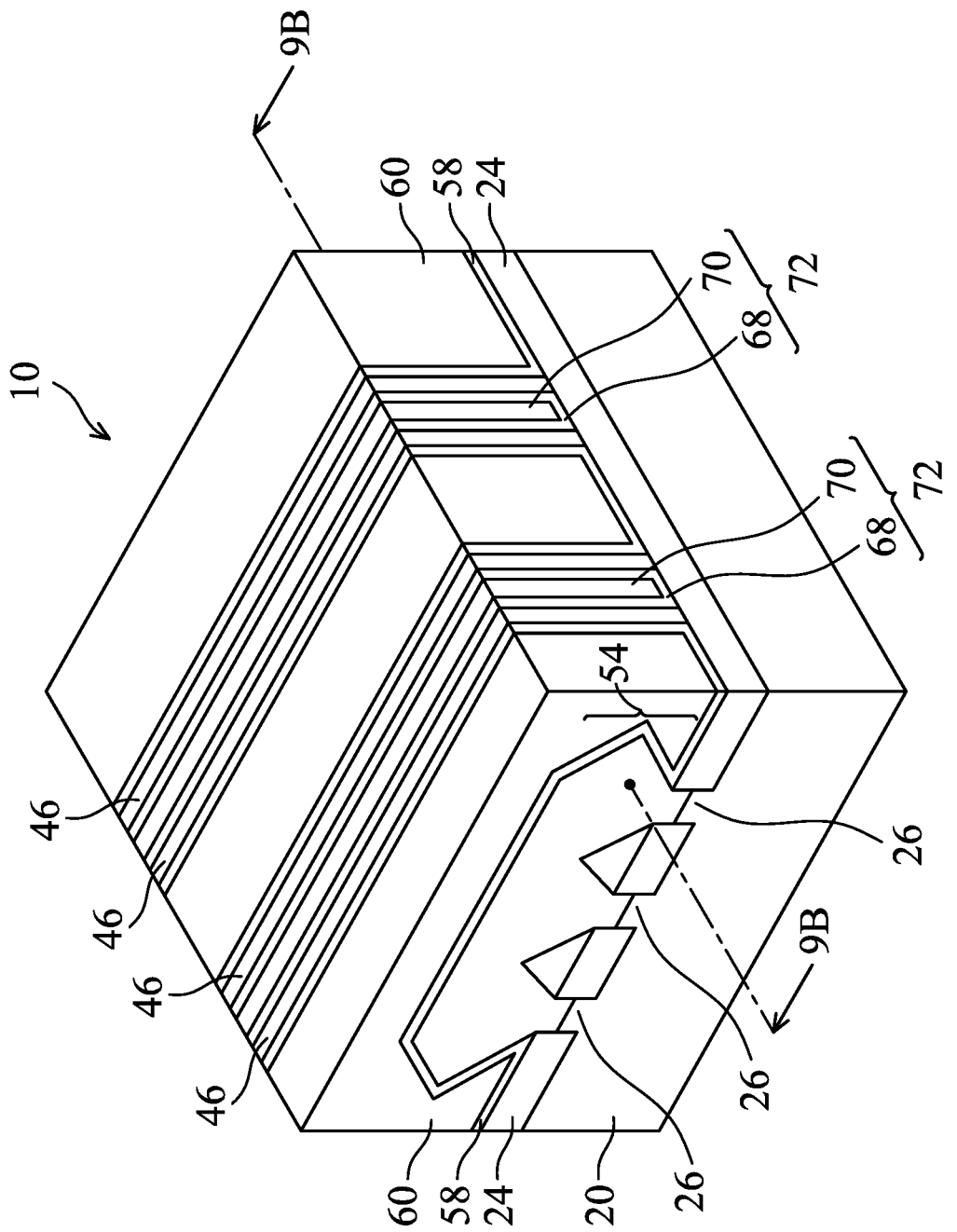
Figure 9B:
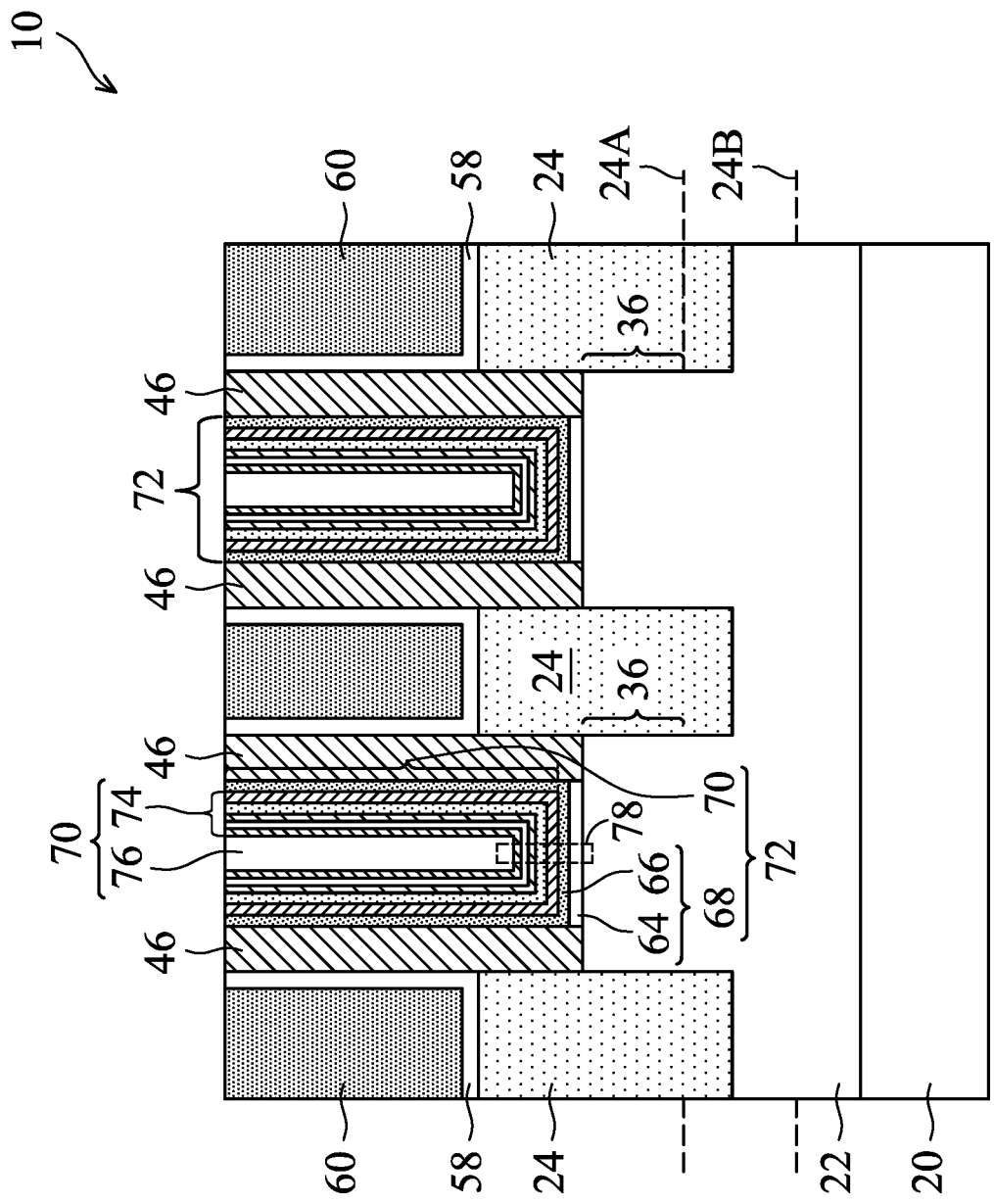

FIG. 7B illustrates the reference cross-section 7B-7B in FIG. 7A, in which dummy gate stacks 38 are illustrated. Next, the dummy gate stacks 38 including hard mask layers 44, dummy gate electrodes 42 and dummy gate dielectrics 40 are etched, forming trenches 62 between gate spacers 46, as shown in FIG. 8. The respective process is illustrated as process 216 in the process flow 200 shown in FIG. 24. The top surfaces and the sidewalls of protruding fins 36 are exposed to trenches 62. Next, as shown in FIGS. 9A and 9B, replacement gate stacks 72 are formed in trenches 62 (FIG. 8). The respective process is illustrated as process 218 in the process flow 200 shown in FIG. 24. FIG. 9B illustrates the reference cross-section 9B-9B in FIG. 9A. Replacement gate stacks 72 include gate dielectrics 68 and the corresponding gate electrodes 70.

In accordance with some embodiments of the present disclosure, a gate dielectric 68 includes Interfacial Layer (IL) 64 as its lower part, as shown in FIG. 9B. IL 64 is formed on the exposed surfaces of protruding fins 36. IL 64 may include an oxide layer such as a silicon oxide layer, which is formed through the thermal oxidation of protruding fins 36, a chemical oxidation process, or a deposition process. Gate dielectric 68 may also include high-k dielectric layer 66 formed over IL 64. High-k dielectric layer 66 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layer 66 is overlying, and may contact, IL 64.

High-k dielectric layer 66 is formed as a conformal layer, and extends on the sidewalls of protruding fins 36 and the top surface and the sidewalls of gate spacers 46. In accordance with some embodiments of the present disclosure, high-k dielectric layer 66 is formed using ALD, CVD, PECVD, Molecular-Beam Deposition (MBD), or the like.

Further referring to FIG. 9B, gate electrode 70 is formed on gate dielectric 68. Gate electrode 70 may include a plurality of stacked layers 74, which may be formed as conformal layers, and filling-metal regions 76 filling the rest of the trenches unfilled by the plurality of stacked layers 74. Stacked layers 74 may include a barrier layer, a work function layer over the barrier layer, and one or a plurality of metal capping layers over the work function layer. The detailed structure and the formation method of the stacked layers 74 are discussed referring to FIGS. 10 through 15.

Figure 24:
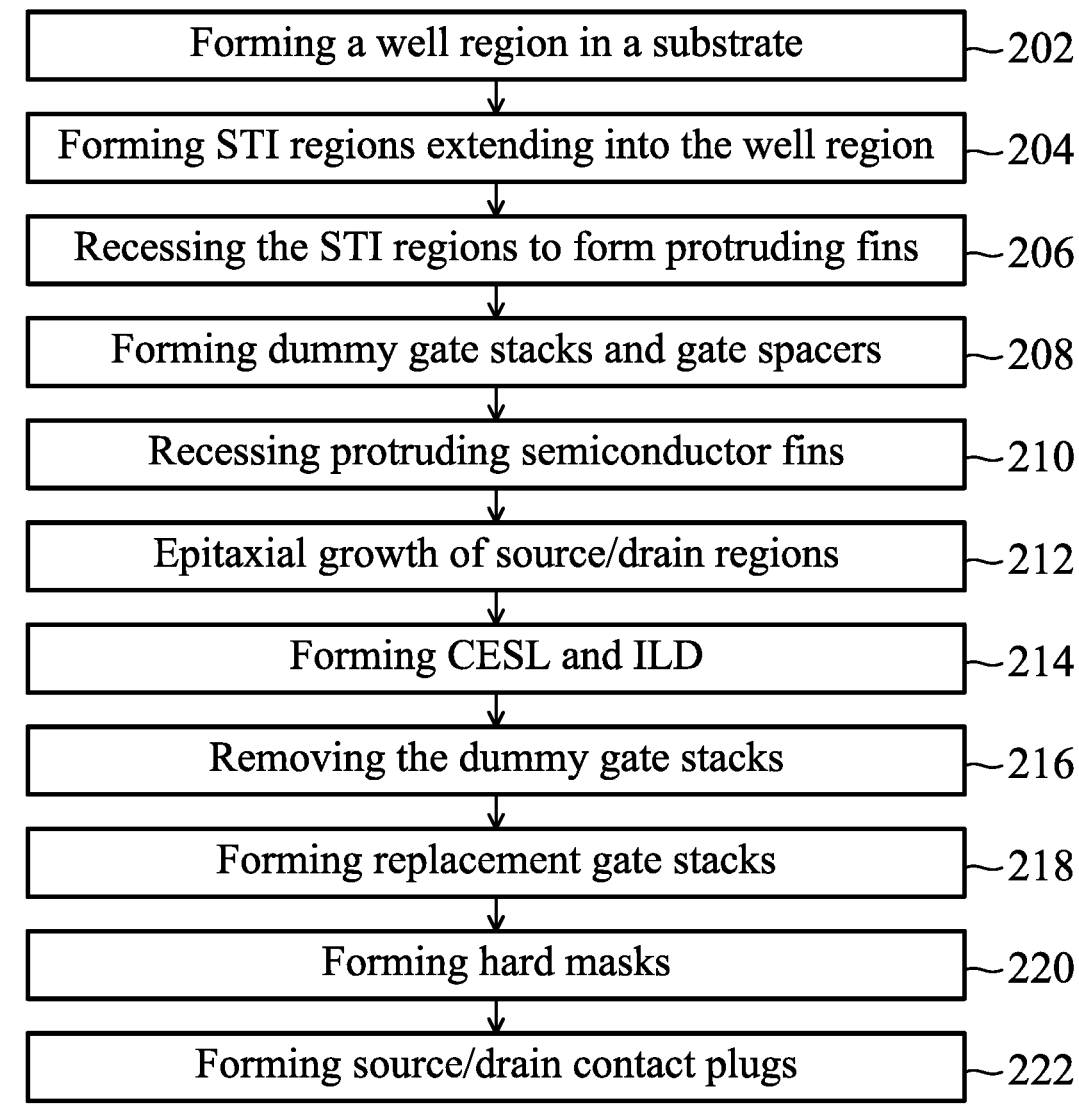
FIG. 24 illustrates a process flow for forming a FinFET in accordance with some embodiments.
Figure 25:
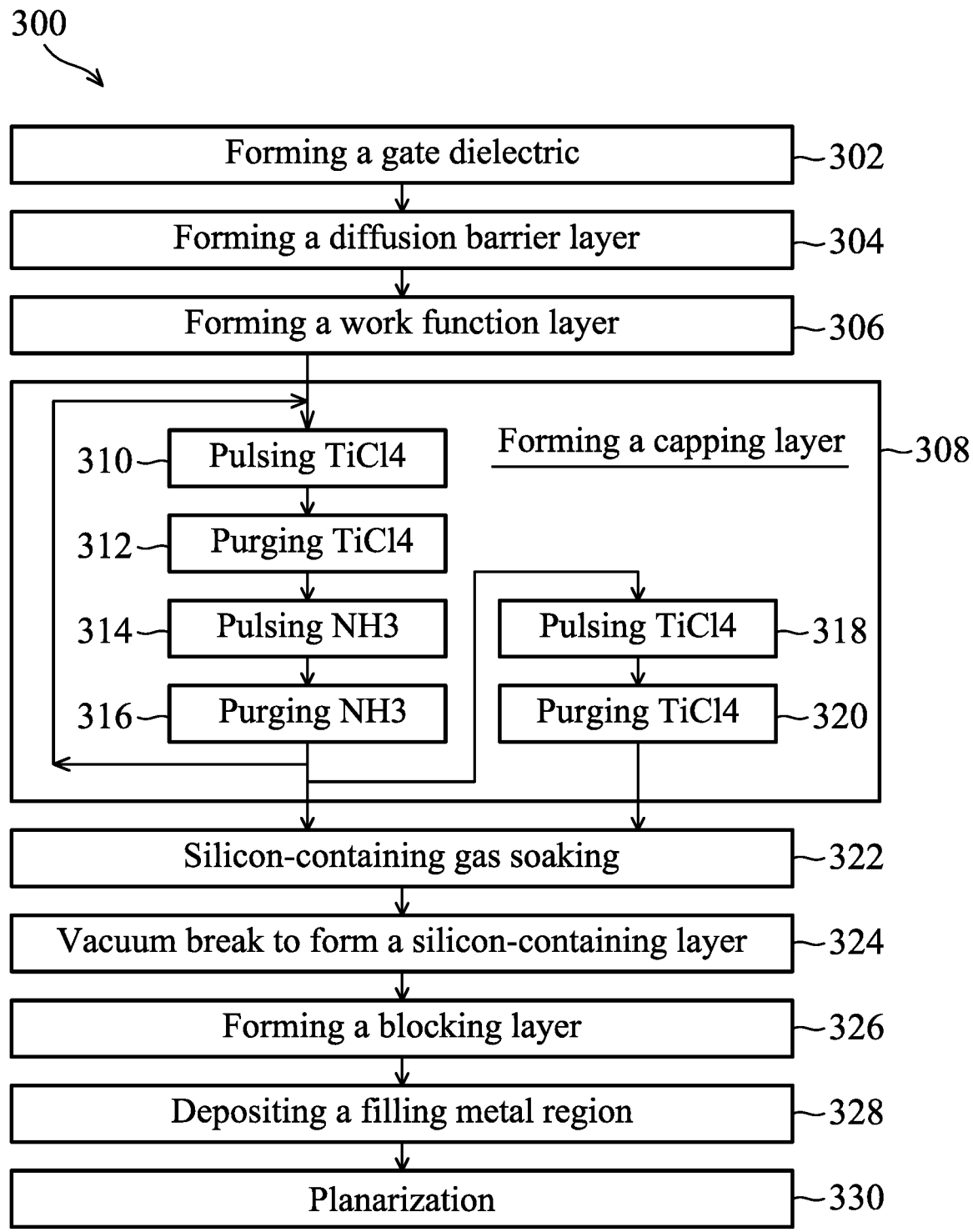
FIG. 25 illustrates a process flow for forming a gate stack in a FinFET in accordance with some embodiments.

FIG. 9B schematically illustrates region 78, in which a portion of fin 36, a portion of gate dielectric 68, a portion of stacked layers 74, and a portion of filling-metal region 76 are included. FIGS. 10 through 15 illustrate the formation of the features that extend into region 78 in accordance with some embodiments. The respective process is illustrated as process flow 300 as shown in FIG. 25. The process 218 as shown in FIG. 24 is achieved through process flow 300.

Figure 10:
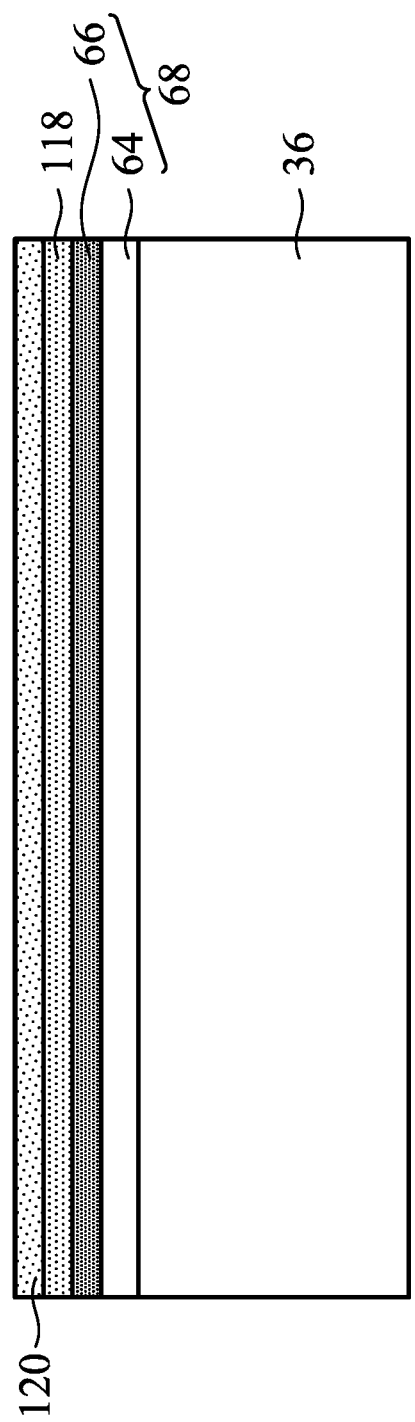
FIGS. 10 through 15 illustrate the perspective views and cross-sectional views of intermediate stages in the formation of a gate stack of a transistor in accordance with some embodiments.

Referring to FIG. 10, gate dielectric 68, which includes IL 64 and high-k dielectric layer 66, is formed. The respective process is illustrated as process 302 in the process flow 300 shown in FIG. 25. IL 64 is formed on protruding fin 36. High-k dielectric layer 66 is formed over IL 64. In accordance some embodiments, adhesion layer (which is also a diffusion barrier layer) 118 is formed over high-k dielectric layer 66. The respective process is illustrated as process 304 in the process flow 300 shown in FIG. 25. Adhesion layer 118 may be formed of TiN or Titanium Silicon Nitride (TSN). The TiN layer may be formed using ALD or CVD, and the TSN layer may include alternatingly deposited TiN layers and SiN layers, which are formed using ALD, for example. Since the TiN layers and SiN layers are very thin, these layers may not be able to be distinguished from each other, and are hence referred to as a TSN layer.

Work-function layer 120 is formed over adhesion layer 118. The respective process is illustrated as process 306 in the process flow 300 shown in FIG. 25. The work function layer 120 determines the work function of the gate, and includes at least one layer, or a plurality of layers formed of different materials. The material of the work function layer is selected according to whether the respective FinFET is an n-type FinFET or a p-type FinFET. For example, when the FinFET is an n-type FinFET, work function layer 120 may include a titanium aluminum (TiAl) layer over the TaN layer. When the FinFET is a p-type FinFET, work function layer 120 may include a TaN layer, a TiN layer over the TaN layer, and may or may not include a TiAl layer over the TiN layer. It is appreciated that the work function layers may include different materials, which are also contemplated.

Figure 11:
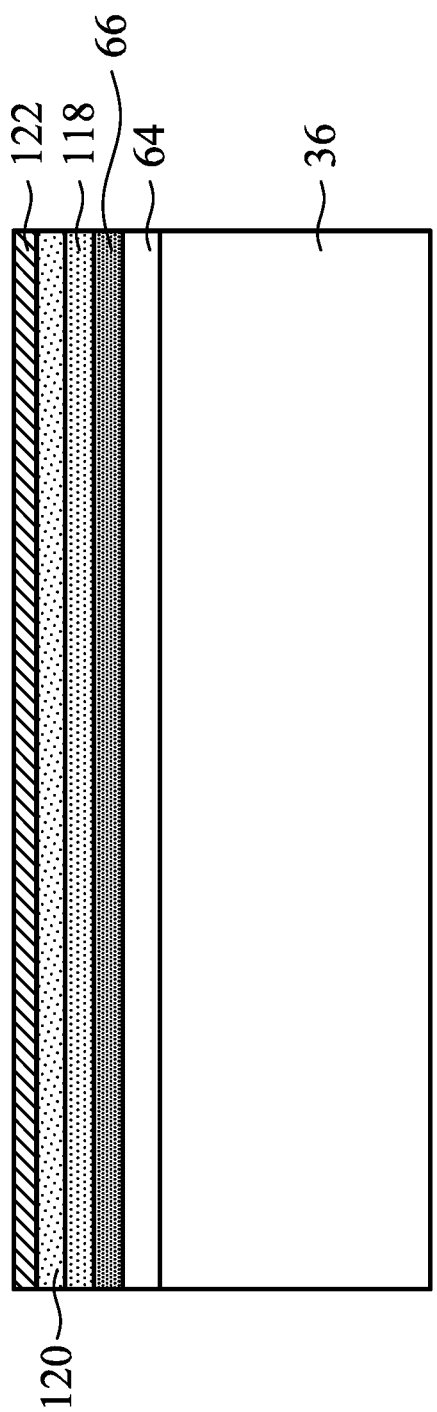

In accordance with some embodiments of the present disclosure, a capping layer 122 is formed over work function layer 120, as shown in FIG. 11. The respective process is illustrated as process 308 in the process flow 300 shown in FIG. 25. Capping layer 122 may be formed of TiN in accordance with some embodiments, and other materials such as TaN may be used. In accordance with some embodiments, capping layer 122 is formed using ALD. The thickness of capping layer 122 may be in the range between about 10 nm and about 50 nm.

In accordance with some embodiments, the formation of capping layer 122 includes pulsing $TiCl_4$ gas into the respective process ALD chamber (for example, chamber 404 in FIG. 22), and purging $TiCl_4$. The respective processes are illustrated as processes 310 and 312, respectively, in the process flow 300 shown in FIG. 25. The pulsing duration (the time $TiCl_4$ is in contact with wafer 10) may be in the range between about 0.1 seconds and about 10 seconds. The flow rate of $TiCl_4$ may be in the range between about 50 sccm and about 150 sccm. Throughout the description, the pulsing and the purging of $TiCl_4$ are collectively referred to as a $TiCl_4$ cycle.

Next, ammonia ($NH_3$) is pulsed into the ALD chamber, and is then purged. The respective processes are illustrated as process 314 and 316, respectively, in the process flow 300 shown in FIG. 25. The pulsing duration (the time $NH_3$ is in contact with wafer 10) may be in the range between about 0.1 seconds and about 10 seconds. Throughout the description, the pulsing and the purging of $NH_3$ are collectively is referred to as a $NH_3$ cycle. The flow rate of $NH_3$ may be in the range between about 50 sccm and about 100 sccm. During the formation of capping layer 122, the temperature of wafer 10 is in the range between about 400° C. and about 600° C. The pressure of each of the $TiCl_4$ and $NH_3$ may be in the range between about 4 torr and about 20 torr.

A $TiCl_4$ cycle and a $NH_3$ cycle in combination result in an (atomic) layer of TiN to be formed, and hence a $TiCl_4$ cycle and a $NH_3$ cycle are in combination referred to as an ALD loop. The formation of capping layer 122 may include a plurality of ALD loops, and process flow 300 includes the loop back to process 310. The resulting thickness of capping layer 122 may be in the range between about 10 nm and about 50 nm.

In accordance with some embodiments, the formation of capping layer 122 is ended with an $NH_3$ cycle, which is indicated by ending with process 316 to proceed to process 322 in FIG. 25. In accordance with other embodiments of the present disclosure, the formation of capping layer 122 is ended with a $TiCl_4$ cycle, which includes the pulsing and the purging of $TiCl_4$ as shown as processes 318 and 320 in the process flow 300 shown in FIG. 25. As will be discussed in subsequent paragraphs, ending the formation of capping layer 122 with a $TiCl_4$ cycle results in improved results. When the formation of capping layer 122 is ended with a $TiCl_4$ cycle, a second pulsing duration of the ending $TiCl_4$ pulsing (process 318 in FIG. 25) may be prolonged to be longer than the first duration of the $TiCl_4$ pulsing (process 310 in FIG. 25) in the preceding ALD loops. For example, the pulsing duration of the ending $TiCl_4$ pulsing may be in the range between about 0.1 seconds and about 10 seconds. The Ratio of the second duration to the first duration is greater than 1.0, and may be in the range between about 2.0 and about 5.0.

During the ending $TiCl_4$ pulsing 318, wafer 10 is also heated, for example, to a temperature in the range between about 400° C. and about 600° C. No plasma is generated in accordance with some embodiments. The ending $TiCl_4$ pulsing results in the resulting molecules (such as $Ti_xCl_y$ molecules, with x and y being integers) to be exposed and connected to the underlying capping layer 122. The ending $TiCl_4$ pulsing process is used to improve the bonding of capping layer 122 to subsequently provided silicon, as discussed in subsequent paragraphs.

Figure 12:
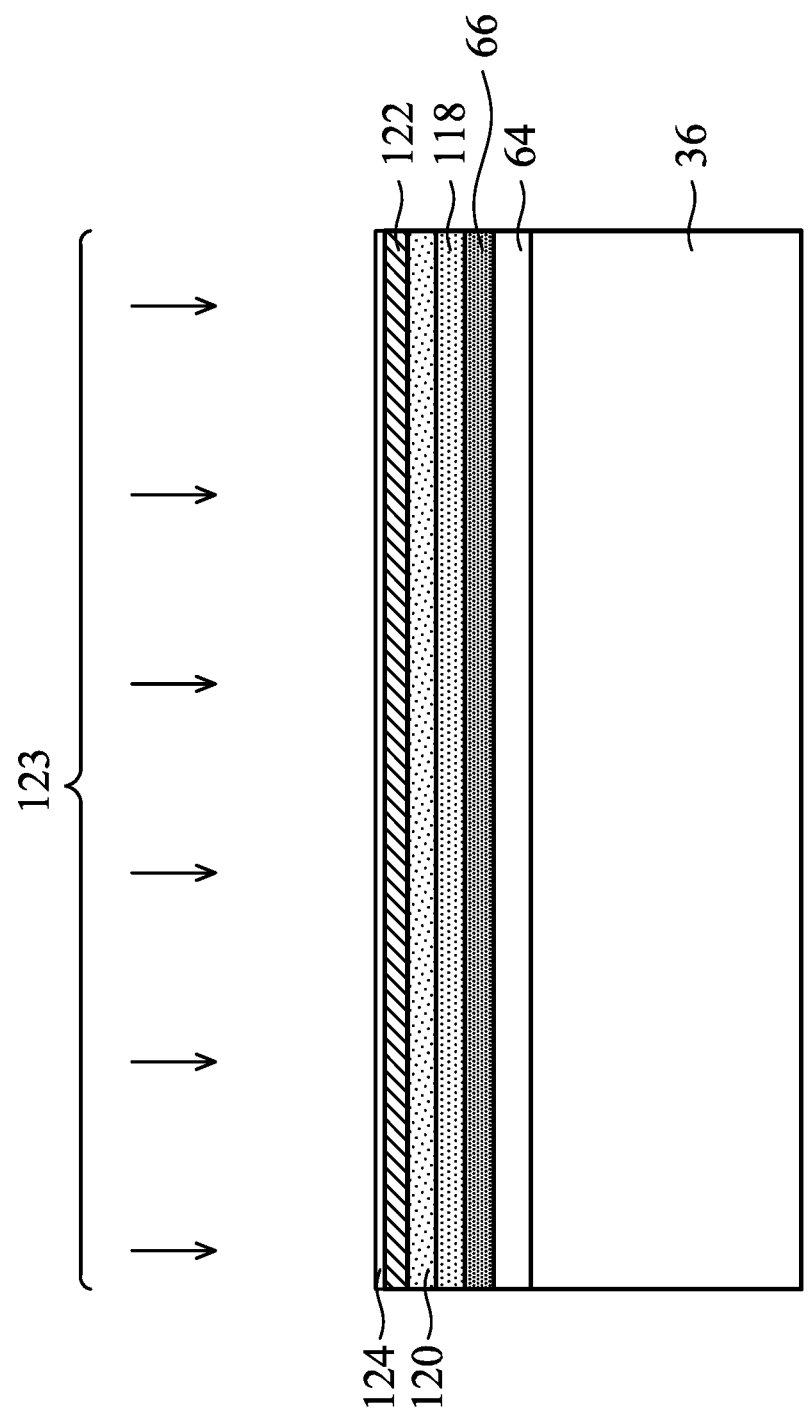

FIG. 12 illustrates a soaking process (represented by arrows 123) using a silicon-containing gas, which may be $SiH_4$, $Si_2H_6$, Dichlorosilane (DCS), or the like, or combinations thereof. The respective process is illustrated as process 322 in the process flow 300 shown in FIG. 25. During the silicon-containing gas soaking, wafer 10 is heated, for example, to a temperature in the range between about 400° C. and about 600° C. The flow rate of the silicon-containing gas may be in the range between about 300 sccm and about 500 sccm. The pressure of the silicon-containing gas may be in the range between about 4 torr and about 20 torr. No plasma is generated in accordance with some embodiments. The soaking duration may be in the range between about 180 seconds and about 600 seconds.

FIG. 12 schematically illustrates the formation of silicon layer 124 as a result of the silicon-containing gas soaking. In accordance with some embodiments of the present disclosure, the thickness of silicon layer 124 is in the range between about 1 Å and about 15 Å, while the thickness may be greater or smaller.

Figure 22:
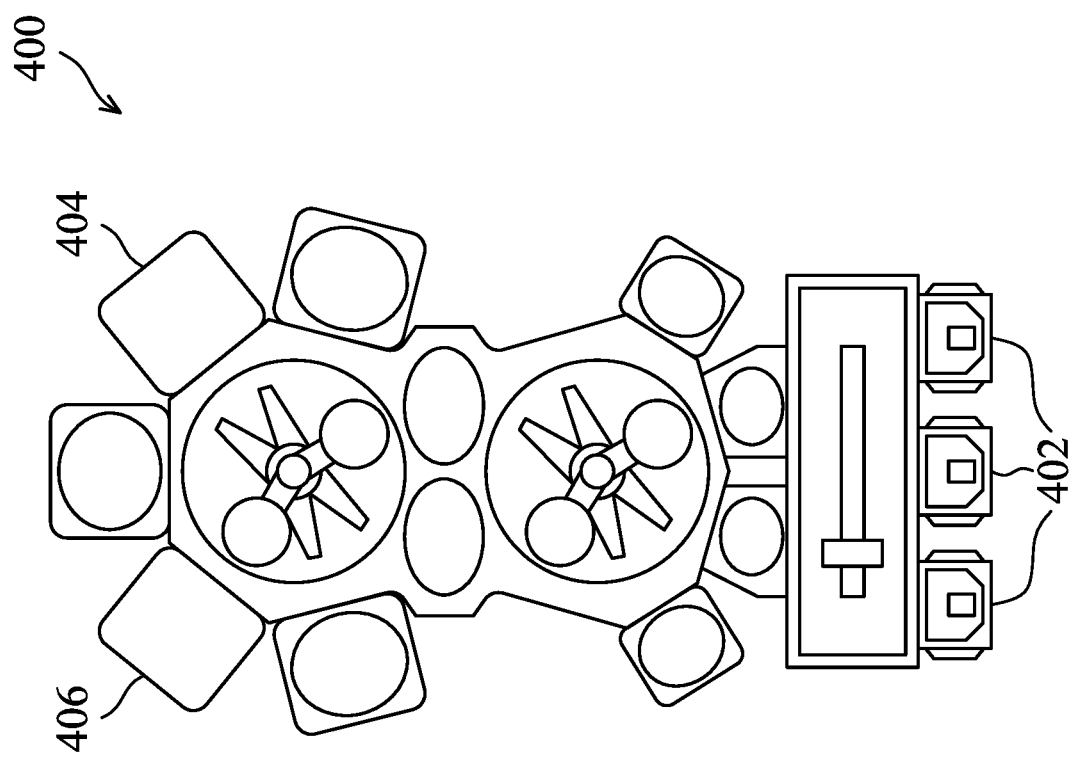
FIG. 22 schematically illustrates a production tool in which a plurality of layers in a gate stack are in-situ formed in accordance with some embodiments.

The formation of work function layer 120, the formation of capping layer 122, the ending $TiCl_4$ pulsing process, and silicon-containing gas soaking process may be in-situ performed in a same vacuum environment, so that no vacuum break occurs between these processes. These processes are performed consecutively, and may be performed in different process chambers that are in a same platform, which has a same vacuum environment. For example, FIG. 22 illustrates a production tool 400, which includes loadlocks 402 and a plurality of process chambers including vacuum chambers 404 and 406 sharing the same vacuum environment. In accordance with some embodiments, work function layer 120 is deposited in process chamber 404, while the formation of capping layer 122, the ending $TiCl_4$ pulsing process, and the silicon-containing gas soaking process are performed in process chamber 406, which is designed for ALD processes.

Figure 18:
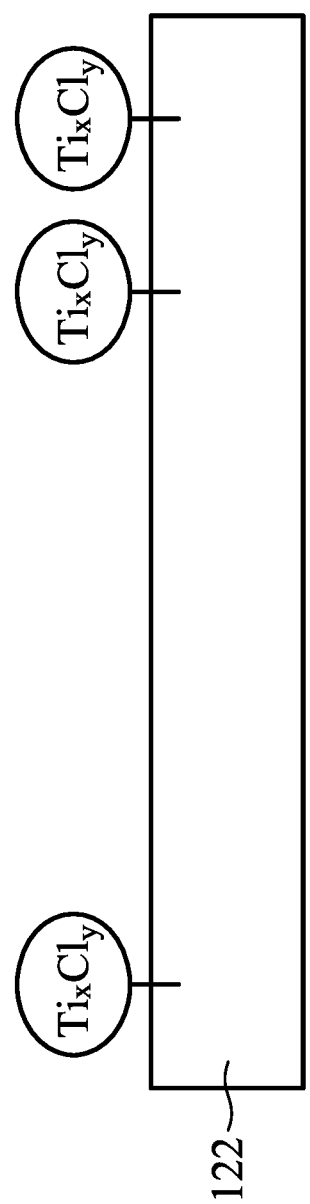
FIG. 18 schematically illustrates the attachment of $SiH_4$ molecules to a TiN layer whose formation is ended with an $NH_3$ cycle in accordance with some embodiments.

FIG. 18 schematically illustrates a top surface of capping layer 122, which is ended with an $NH_3$ cycle. There are some $Ti_xCl_y$ molecules on the surface of capping layer 122. $Ti_xCl_y$ molecules have dangling bonds, which are available for silicon atoms to attach. However, since the process is ended with an $NH_3$ cycle, a majority of the $Ti_xCl_y$ molecules may be terminated by $NH_3$ molecules (illustrated as blanks having no $Ti_xCl_y$), leaving limited number of dangling bonds. The amount of silicon atoms that can be attached is thus limited.

Figure 19:
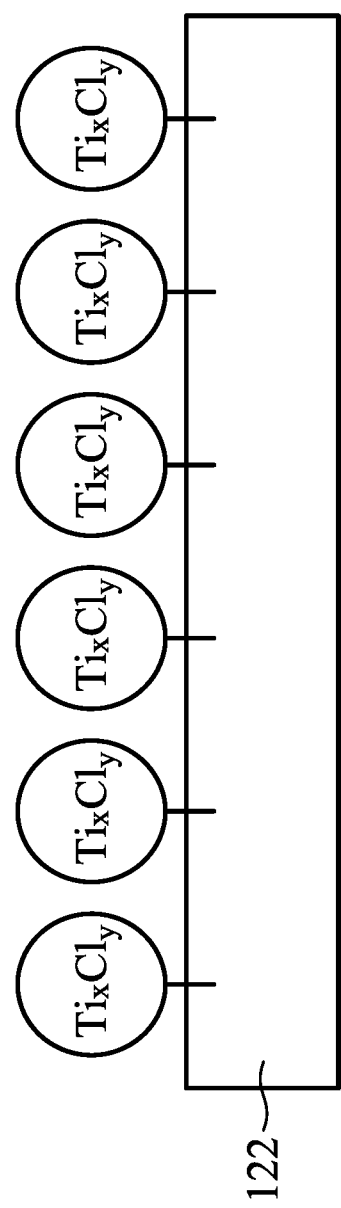
FIG. 19 schematically illustrates the attachment of $SiH_4$ molecules to a TiN layer whose formation is ended with a $TiCl_4$ cycle in accordance with some embodiments.

FIG. 19 schematically illustrates a top surface of capping layer 122, which is ended with a $TiCl_4$ cycle. As a result, more $Ti_xCl_y$ molecules are on the surface of capping layer 122. The amount of silicon atoms that can be attached is thus increased compared to the capping layer formation ended with an $NH_3$ cycle.

Figure 23:
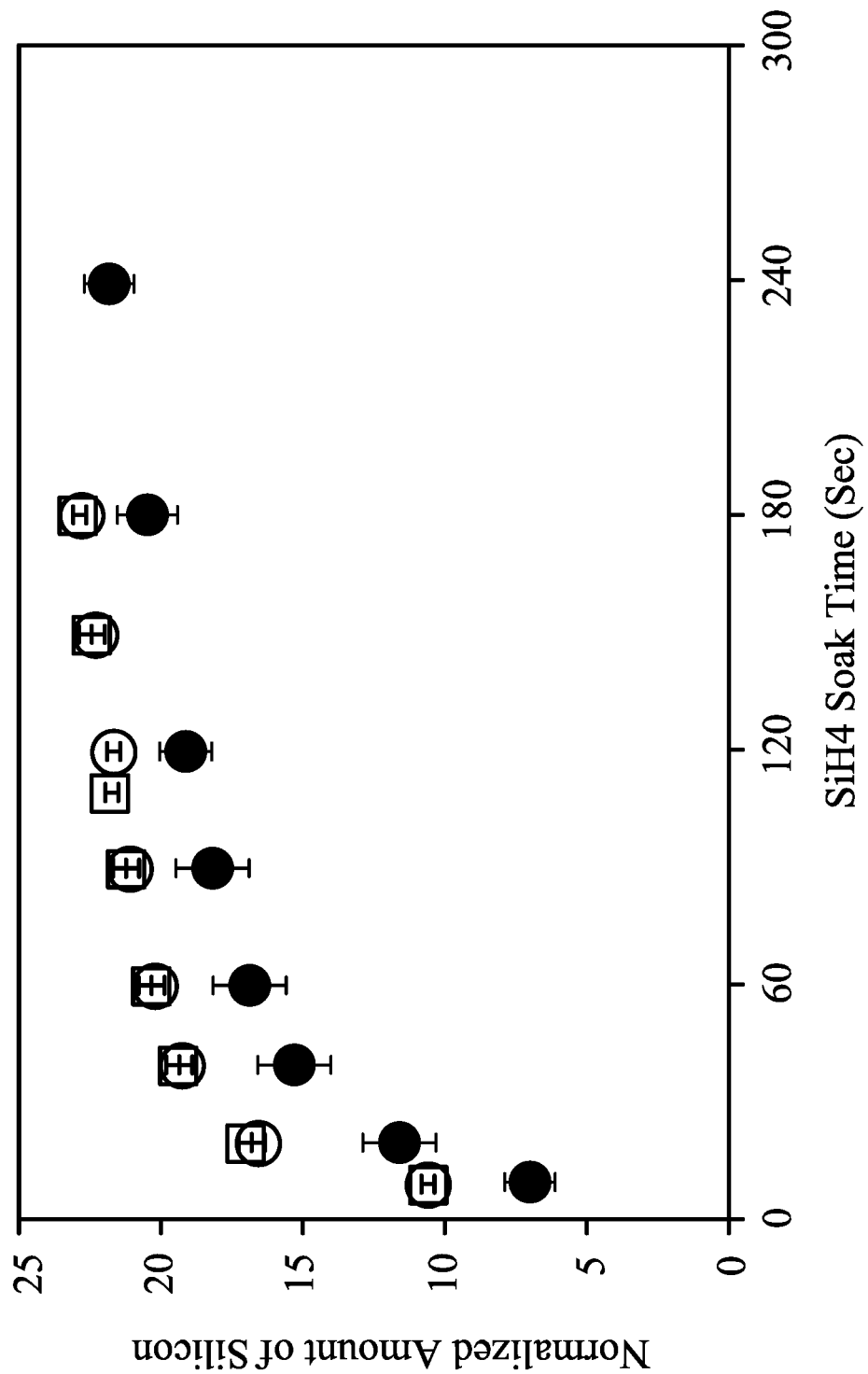
FIG. 23 illustrates the normalized amount of silicon attached to surfaces of TiN layers whose formation are ended with $NH_3$ cycles or $TiCl_4$ cycles in accordance with some embodiments.

FIG. 23 illustrates the comparison of results, wherein the normalized amount of silicon attached to the surface of capping layers is illustrated as a function of soaking time. The solid circles are the results of the mount of silicon attached to a capping layer formed using an $NH_3$ ending cycles. The hollow circles and squares are the results of the mount of silicon attached to a capping layer formed using $TiCl_4$ ending cycles. The data show that by using the $TiCl_4$ ending cycles, more silicon can be attached.

Figure 13:
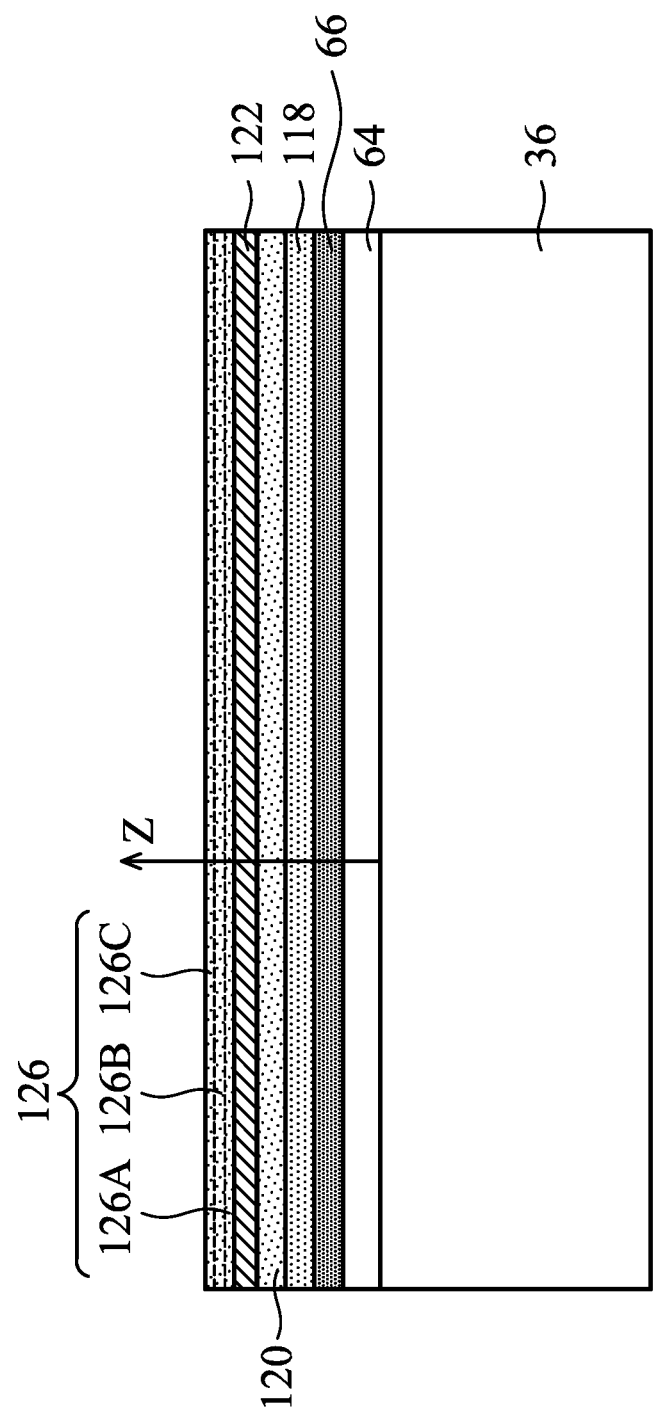

Referring back to FIG. 13, after the silicon-containing gas soaking, a vacuum break may be performed, and silicon layer 124 is exposed to open air. The respective process is illustrated as process 324 in the process flow 300 shown in FIG. 25. As a result of exposing the silicon layer 124 to open air (clean air, which is at room temperature, for example, in the range between about 20° C. and about 25° C.), silicon layer 124 (FIG. 12) is oxidized to form silicon-containing layer 126, as shown in FIG. 13.

In the exposure of silicon layer 124, the oxygen in the air reacts with silicon layer 124 to form silicon oxide layer 126C. Silicon oxide layer 126C is rich in oxygen and silicon, and may also include other elements such as nitrogen and titanium. Accordingly, silicon oxide layer 126C is actually an intermixing layer of these elements, and is also referred to as silicon-oxide intermixing layer 126C hereinafter. The thickness of silicon-oxide intermixing layer 126C may be in the range between about 0.1 nm and about 10 nm. On the other hand, since silicon layer 124 contacts capping layer 122, which includes TiN, silicon nitride intermixing layer 126A may be formed, partially due to the elevated temperature in the silicon-containing gas soaking. Silicon nitride intermixing layer 126A is rich in silicon and nitrogen, and may also include other elements such as oxygen and titanium. Some portion of aluminum, which comes from work function layer 120, may also be diffused into silicon nitride intermixing layer 126A. The thickness of silicon nitride intermixing layer 126A may be in the range between about 0.1 nm and about 10 nm.

Depending on the thickness of silicon layer 124 (FIG. 12), there may be, or may not be, silicon intermixing layer 126B, which is rich in silicon, and may contain other elements such as nitrogen, oxygen, titanium, or the like, and may contain a small amount of aluminum. Silicon nitride intermixing layer 126A, silicon intermixing layer 126B, and silicon-oxide intermixing layer 126C are in combination referred to as silicon-containing layer 126 hereinafter. Silicon-containing layer 126 may have a thickness in the range between about 0.1 nm and about 1.5 nm.

Figure 20:
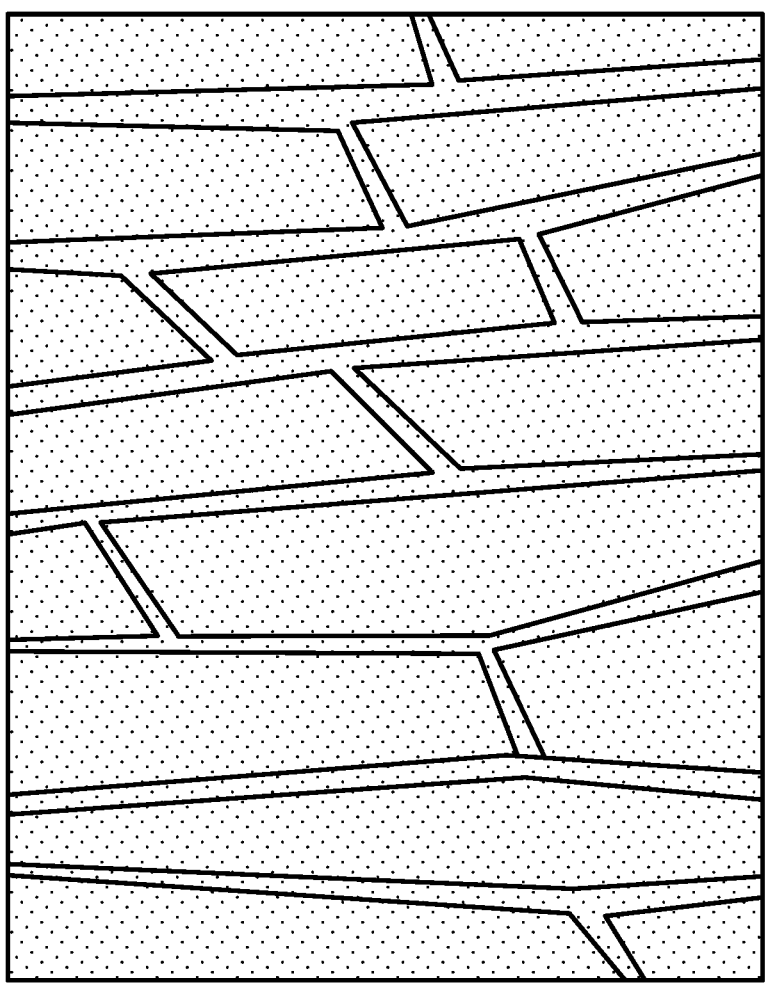
FIG. 20 schematically illustrates the diffusion paths in a poly-crystalline TiN layer in accordance with some embodiments.

Although being very thin, silicon-containing layer 126 has the function of blocking oxygen from diffusing downwardly to oxidize work function layer 120, and blocking the metal (such as aluminum) from diffusing out of the work function layer 120 to cause the drift in the threshold voltage of the respective FinFET. FIG. 20 schematically illustrates a multi-grain structure of capping layer 122, which includes a plurality of grains. Oxygen and metal atoms may diffuse through the paths between the grains of capping layer 122. Silicon-containing layer 126, which is over capping layer 122 (not shown in FIG. 20), acts as a blocking barrier to block the diffusion.

Figure 21:
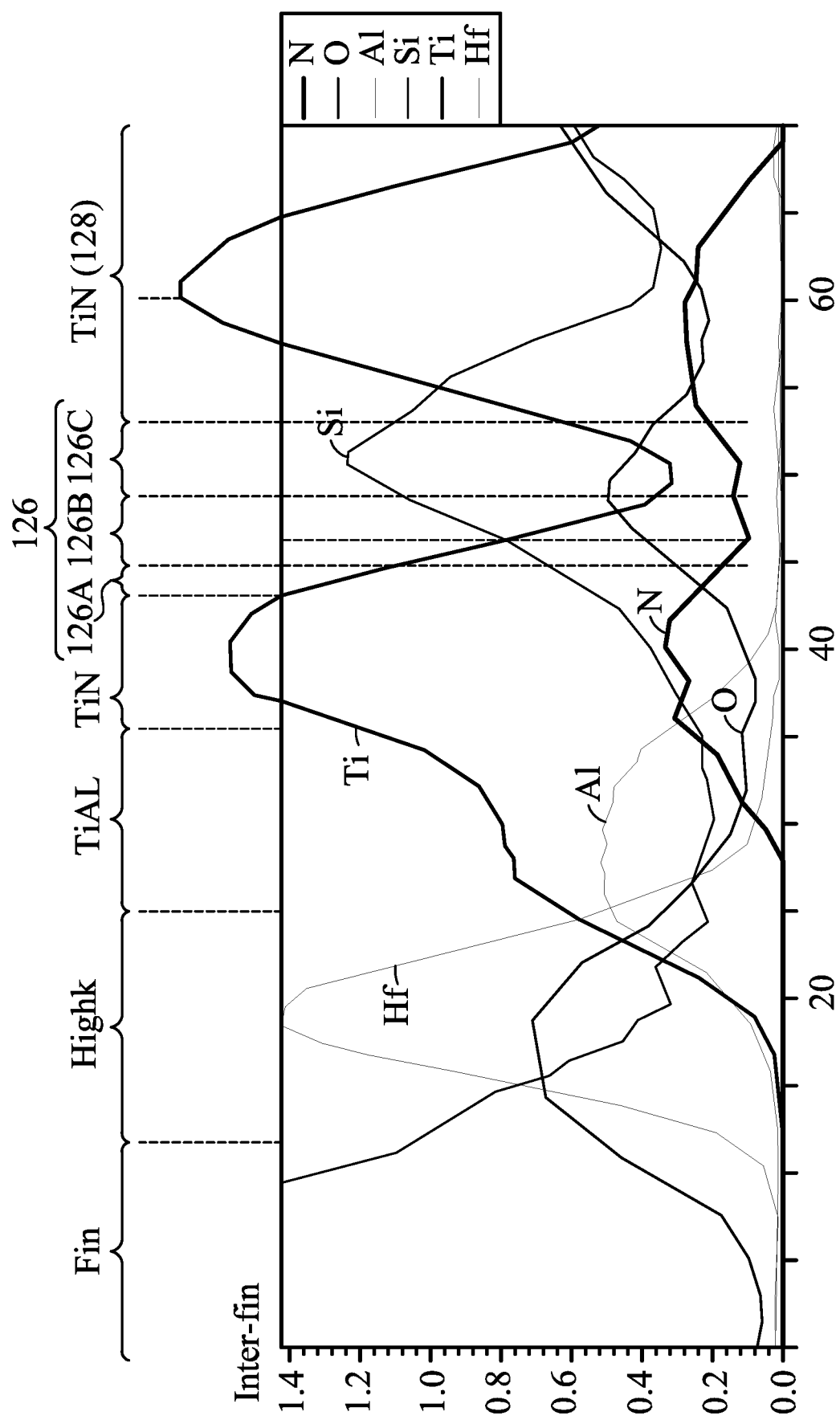
FIG. 21 illustrates the distribution of different elements in a gate stack of a transistor in accordance with some embodiments.

Referring back to FIG. 13, it is appreciated that due to the diffusion of elements, there may be no clear boundary between the sub-layers such as silicon nitride intermixing layer 126A, silicon intermixing layer 126B, and silicon-oxide intermixing layer 126C. FIG. 21 illustrates the amount of some elements as a function of the distance Z (FIG. 13), which is measured from the top surface of protruding fin 36 in FIG. 13. The X-axis (FIG. 21) represents the distance Z, and the Y axis represents the normalized amount of element oxygen (O), nitrogen (N), aluminum (Al), titanium (Ti), and hafnium (Hf). The range of protruding fin 36 (including Si), high-k dielectric layer 66 (including Hf), work function layer 120 (including TiAl), capping layer 122 (including TiN), silicon-containing layer 126, and blocking layer TiN (formed in a subsequent step) are marked briefly. Comparing the result as shown in FIG. 21 with the results of the samples (not shown) whose formation processes do not include silicon-containing gas soaking processes, it is found that the diffusion of oxygen into capping layer 122 and the diffusion of aluminum through silicon-containing layer 126 is reduced.

Figure 14:
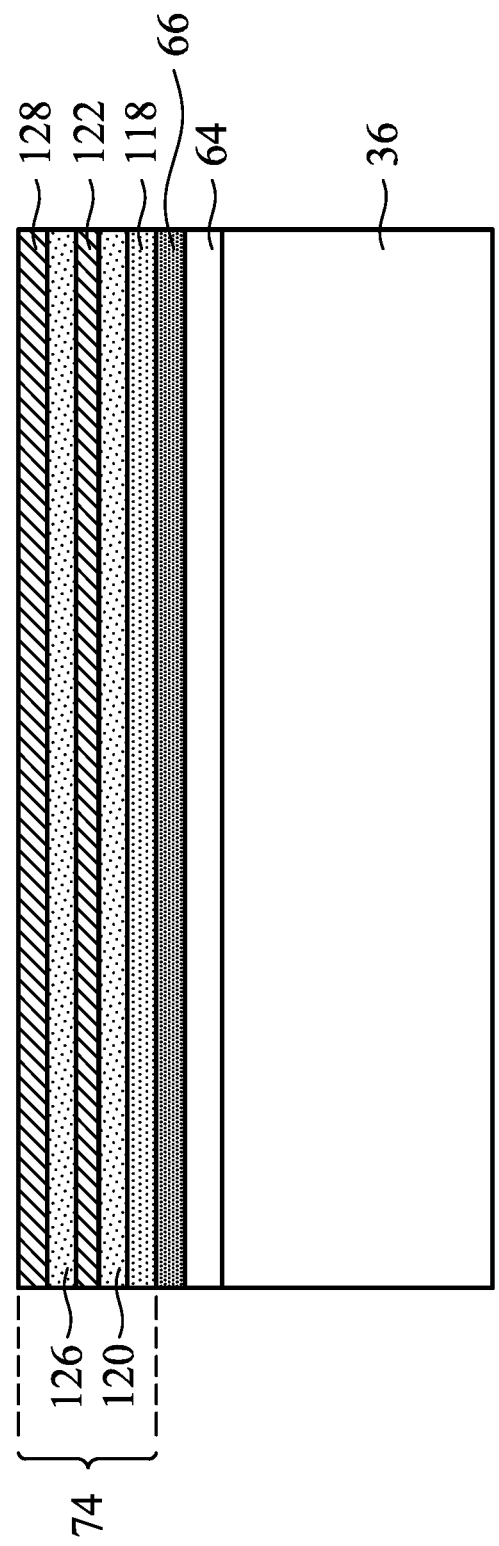

FIG. 14 illustrates the formation of blocking layer 128. The respective process is illustrated as process 326 in the process flow 300 shown in FIG. 25. The formation method, material, thickness, etc., of blocking layer 128 may be selected from the candidate methods, candidate materials, candidate thicknesses, and the like for forming capping layer 122. The details are thus not repeated. For example, blocking layer 128 may be formed of TiN, which may be formed using ALD. Diffusion barrier layer 118, work function layer 120, silicon-containing layer 126, and blocking layer 128 in combination correspond to stacked layers 74 in FIG. 9B.

Figure 15:
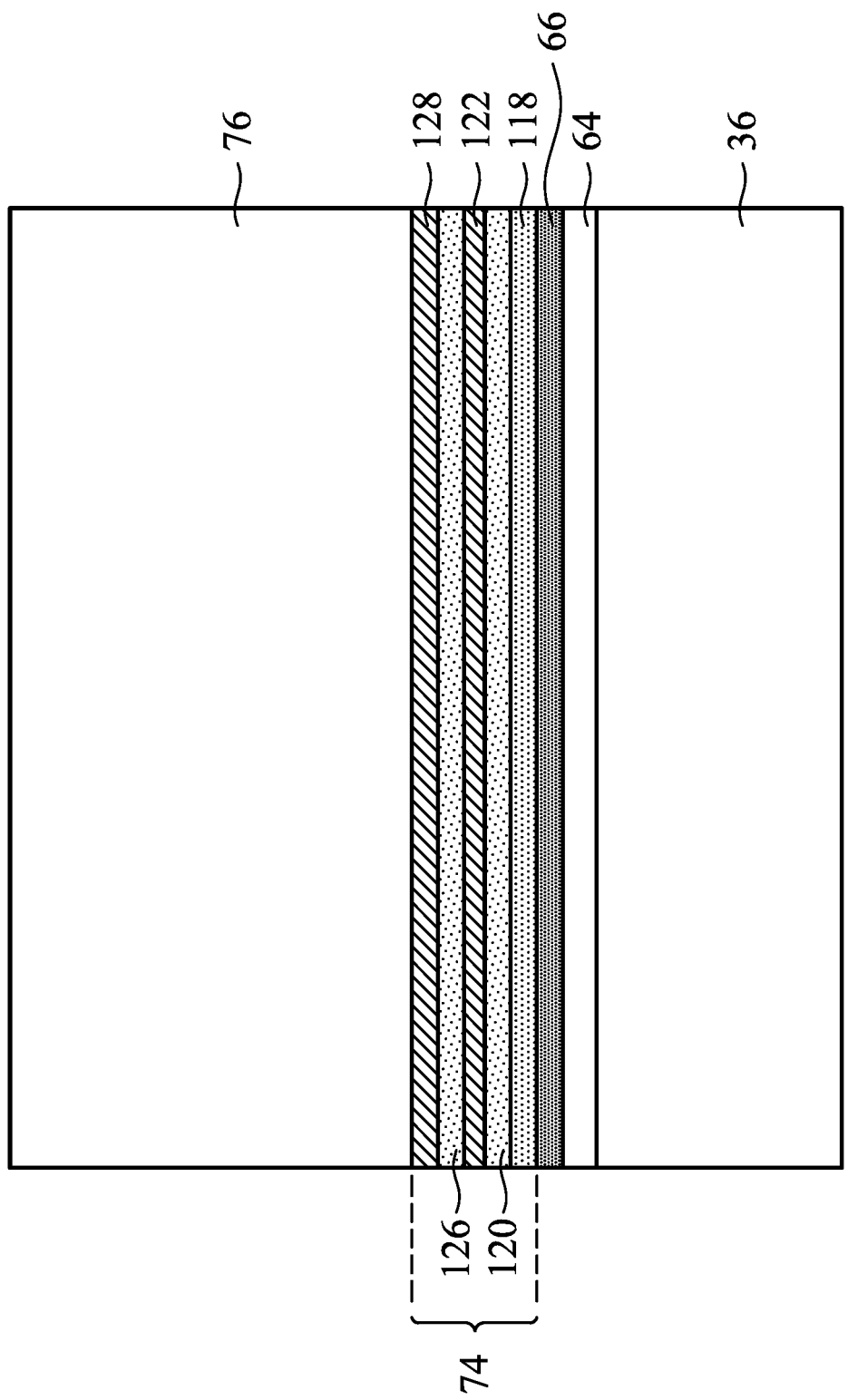

FIG. 15 illustrates the deposition of filling-metal region 76. The respective process is illustrated as process 328 in the process flow 300 shown in FIG. 25. In accordance with some embodiments, filling-metal region 76 is formed of tungsten or cobalt, which may be formed using chemical vapor deposition. In accordance with some embodiments, $WF_6$ and $SiH_4$ are used as process gases for depositing tungsten. After the formation of filling-metal region 76, a planarization process may be performed to remove excess portions of the deposited layers as shown in FIG. 15, resulting in the gate stacks 72 as shown in FIGS. 9A and 9B. The respective planarization process is illustrated as process 330 in the process flow 300 shown in FIG. 25.

Figure 16:
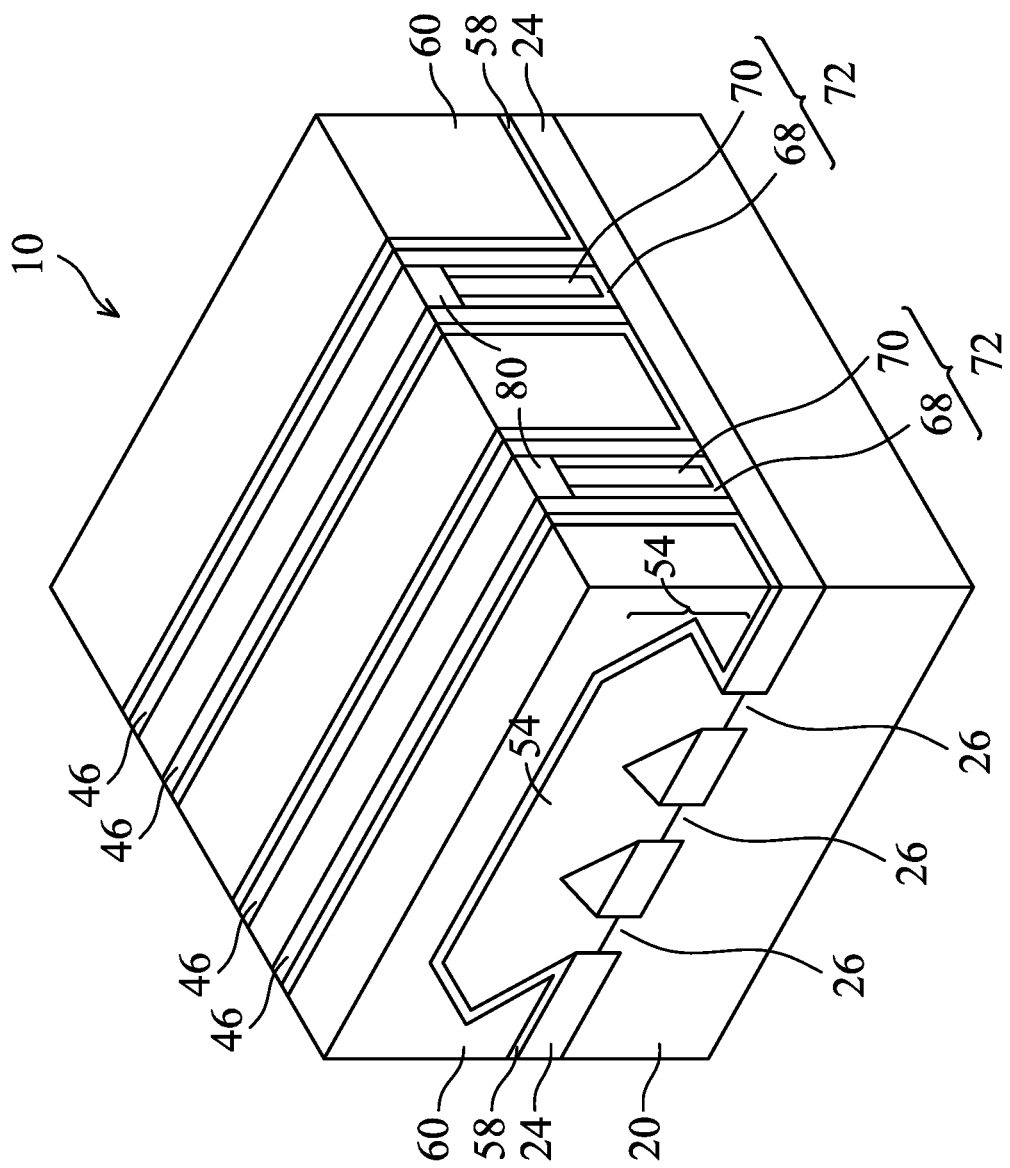

FIG. 16 illustrates the formation of hard masks 80 in accordance with some embodiments. The respective process is illustrated as process 220 in the process flow 200 shown in FIG. 24. The formation of hard masks 80 may include performing an etching process to recess gate stacks 72, so that recesses are formed between gate spacers 46, filling the recesses with a dielectric material, and then performing a planarization process such as a CMP process or a mechanical grinding process to remove excess portions of the dielectric material. Hard masks 80 may be formed of silicon nitride, silicon oxynitride, silicon oxy-carbo-nitride, or the like.

Figure 17:
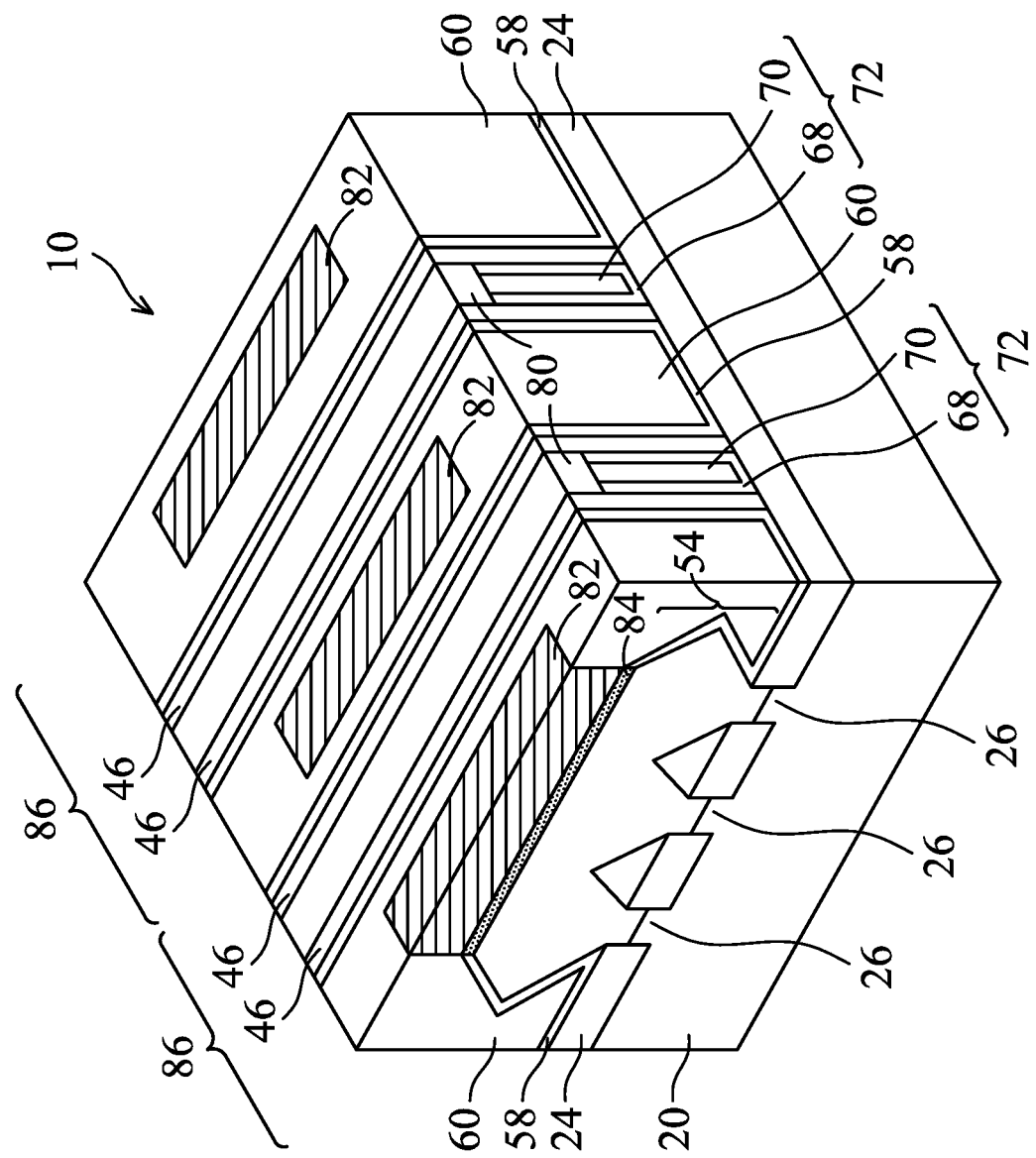

FIG. 17 illustrates the formation of source/drain contact plugs 82. The respective process is illustrated as process 222 in the process flow 200 shown in FIG. 24. The formation of source/drain contact plugs 82 includes etching ILD 60 to expose the underlying portions of CESL 58, and then etching the exposed portions of CESL 58 to reveal source/drain regions 54. In a subsequent process, a metal layer (such as a Ti layer) is deposited and extending into the contact openings. A metal nitride capping layer may be formed. An anneal process is then performed to react the metal layer with the top portion of source/drain regions 54 to form silicide regions 84, as shown in FIG. 17. Next, either the previously formed metal nitride layer is left without being removed, or the previously formed metal nitride layer is removed, followed by the deposition of a new metal nitride layer (such as a titanium nitride layer). A filling-metallic material such as tungsten, cobalt, or the like, is then filled into the contact openings, followed by a planarization to remove excess materials, resulting in source/drain contact plugs 82. Gate contact plugs (not shown) are also formed to penetrate through a portion of each of hard masks 80 to contact gate electrodes 70. FinFETs 86, which may be connected in parallel as one FinFET, is thus formed.

The embodiments of the present disclosure have some advantageous features. Through the silicon-containing gas soaking process, a silicon-containing layer is formed over the work function layer. The silicon-containing layer is thin, and is an intermixing layer including silicon-oxide rich portion and a silicon-nitride rich portion. The silicon-containing layer is effective in preventing oxygen from penetrating downwardly to reach the work function layer, and hence may prevent the oxidation of the work function layer. Furthermore, the silicon-containing layer may prevent the metal in the work function layer from diffusing upwardly, hence may help keep the composition of the work function layer to be stable, and preventing the drift in the threshold voltage of the resulting FinFET. As a result, the threshold roll-up problem, which is the enlargement of the threshold voltage difference between the transistors in different regions (such as transistor-dense regions and transistor-sparse regions) is reduced.

In accordance with some embodiments of the present disclosure, a method of forming an integrated circuit structure includes forming a gate dielectric on a wafer; forming a work function layer over the gate dielectric; depositing a capping layer over the work function layer; soaking the capping layer in a silicon-containing gas to form a silicon-containing layer; after the silicon-containing layer is formed, forming a blocking layer; and forming a metal-filling region over the blocking layer. In an embodiment, the depositing the capping layer comprises plurality of cycles, each comprising: a $TiCl_4$ cycle comprising pulsing and purging $TiCl_4$; and an $NH_3$ cycle comprising pulsing and purging $NH_3$, and the depositing the capping layer is ended with an additional $TiCl_4$ cycle. In an embodiment, the depositing the capping layer comprises plurality of cycles, each comprising: a $TiCl_4$ cycle comprising pulsing and purging $TiCl_4$; and an $NH_3$ cycle comprising pulsing and purging $NH_3$, and the depositing the capping layer is ended with an additional $NH_3$ cycle. In an embodiment, in the soaking the capping layer, the capping layer is soaked in the silicon-containing gas comprising a gas selected from the group consisting of $SiH_4$, $Si_2H_6$, DCS, and combinations thereof. In an embodiment, in the soaking process, the wafer is heated to a temperature in a range between about 400° C. and about 600° C. In an embodiment, the method further includes a vacuum break to expose the silicon-containing layer to air. In an embodiment, the forming the work function layer, the depositing the capping layer, and the soaking the capping layer are in-situ performed in a same vacuum environment. In an embodiment, the depositing the capping layer and the soaking the capping layer are performed in a same process chamber. In an embodiment, the method further includes forming a dummy gate stack on a sidewall and a top surface of a semiconductor fin; forming gate spacers on opposite sides of the dummy gate stack; forming an inter-layer dielectric, with the dummy gate stack and the gate spacers being in the inter-layer dielectric; and removing the dummy gate stack to form a trench between the stack spacers, wherein the gate stack is formed to extend into the trench.

In accordance with some embodiments of the present disclosure, a method of forming an integrated circuit structure includes forming a gate dielectric on a semiconductor region; in a first process chamber of a production tool, forming a work function layer over the gate dielectric; in a second process chamber of the production tool, depositing a first titanium nitride layer over the work function layer; in the second process chamber of the production tool, soaking the first titanium nitride layer in a silicon-containing gas to form a silicon-containing layer, wherein the silicon-containing gas is selected from the group consisting of $SiH_4$, $Si_2H_6$, DCS, and combinations thereof; exposing the silicon-containing layer to oxygen to convert a portion of the silicon-containing layer into a silicon oxide containing layer; forming a second titanium nitride layer over the silicon oxide containing layer; and forming a metal-filling region over the second titanium nitride layer. In an embodiment, the first process chamber and the second process chamber share a same vacuum environment. In an embodiment, the soaking the first titanium nitride layer lasts a period of time between about 180 seconds and about 600 seconds. In an embodiment, the exposing the silicon-containing layer to oxygen comprises exposing the silicon-containing layer to air. In an embodiment, the exposing the silicon-containing layer to oxygen is performed at a room temperature.

In accordance with some embodiments of the present disclosure, an integrated circuit includes a semiconductor region and a gate stack on the semiconductor region. The gate stack includes a gate dielectric; a work function layer over the gate dielectric; a first titanium layer over the work function layer; a silicon-containing layer over the first titanium layer; a second titanium layer over the silicon-containing layer; and a metal-filling region over the second titanium layer. In an embodiment, the silicon-containing layer comprises silicon, oxygen, nitrogen, and titanium. In an embodiment, the silicon-containing layer comprises silicon oxide. In an embodiment, the silicon-containing layer comprises silicon nitride. In an embodiment, the work function layer comprises TiAl.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit structure, the method comprising:
 forming a gate dielectric on a substrate;
 forming a work function layer over the gate dielectric;
 depositing a capping layer comprising titanium nitride over the work function layer, wherein the depositing the capping layer is performed starting with a first $TiCl_4$ pulsing and purging cycle, followed by a $NH_3$ pulsing and purging cycle, wherein the depositing the capping layer is ended with a second $TiCl_4$ pulsing and purging cycle, and wherein the second $TiCl_4$ pulsing and purging cycle is performed at an elevated wafer temperature, and is free from plasma;
 soaking the capping layer in a silicon-containing gas to form a silicon-containing layer;
 after the silicon-containing layer is formed, performing a vacuum break to expose the silicon-containing layer to air and to form a silicon-and-oxygen-containing layer;
 forming a blocking layer over the silicon-and-oxygen-containing layer; and
 forming a metal-filling region over the blocking layer.

2. The method of claim 1, wherein the depositing the capping layer comprises a plurality of cycles, each comprising:
 a $TiCl_4$ cycle comprising pulsing and purging $TiCl_4$; and
 an $NH_3$ cycle comprising pulsing and purging $NH_3$, wherein the second $TiCl_4$ pulsing and purging cycle is performed after a last cycle of the plurality of cycles.

3. The method of claim 1, wherein in the soaking the capping layer, the capping layer is soaked in the silicon-containing gas comprising a gas selected from the group consisting of $SiH_4$, $Si_2H_6$, Dichlorosilane (DCS), and combinations thereof.

4. The method of claim 1, wherein in the soaking the capping layer, the substrate is heated to a temperature in a range between about 400° C. and about 600° C.

5. The method of claim 1, wherein the forming the work function layer, the depositing the capping layer, and the soaking the capping layer are in-situ performed in a same vacuum environment.

6. The method of claim 5, wherein the depositing the capping layer and the soaking the capping layer are performed in a same process chamber.

7. The method of claim 1 further comprising:
 forming a dummy gate stack on a sidewall and a top surface of a semiconductor fin;
 forming gate spacers on opposite sides of the dummy gate stack;
 forming an inter-layer dielectric, with the dummy gate stack and the gate spacers being in the inter-layer dielectric; and
 removing the dummy gate stack to form a trench between the gate spacers, wherein the gate dielectric and the work function layer are formed to extend into the trench.

8. The method of claim 1, wherein the $NH_3$ pulsing and purging cycle that is immediately preceding the second $TiCl_4$ pulsing and purging cycle results a layer of titanium nitride to be deposited.

9. A method comprising:
 forming a gate stack on a semiconductor region, the forming the gate stack comprising:
  forming a gate dielectric;
  depositing a work function layer over the gate dielectric;
  depositing a first titanium nitride layer over the work function layer, wherein the depositing the first titanium nitride layer is performed starting with a first $TiCl_4$ pulsing and purging cycle, followed by a $NH_3$ pulsing and purging cycle, wherein the depositing the first titanium nitride layer is ended with a second $TiCl_4$ pulsing and purging cycle, and wherein the second $TiCl_4$ pulsing and purging cycle is performed at an elevated wafer temperature, and is free from plasma;
  forming a silicon-containing layer over the first titanium nitride layer, wherein the forming the silicon-containing layer comprises a soaking process in a silicon-containing gas;
  depositing a second titanium nitride layer over the silicon-containing layer; and
  depositing a metal-filling region over the second titanium nitride layer.

10. The method of claim 9, wherein the $NH_3$ pulsing and purging cycle that is immediately preceding the second $TiCl_4$ pulsing and purging cycle results a layer of titanium nitride to be deposited.

11. The method of claim 10, wherein the silicon-containing layer is deposited using atomic layer deposition.

12. The method of claim 9, wherein the silicon-containing gas is selected from the group consisting of $SiH_4$, $Si_2H_6$, Dichlorosilane (DCS), and combinations thereof.

13. The method of claim 9, wherein the silicon-containing layer has a thickness in a range between about 0.1 nm and about 1.5 nm.

14. The method of claim 9, wherein the soaking process is performed in the silicon-containing gas selected from the group consisting of $SiH_4$, $Si_2H_6$, Dichlorosilane (DCS), and combinations thereof.

15. A method of forming an integrated circuit structure, the method comprising:
 forming a gate dielectric on a semiconductor region;
 forming a work function layer over the gate dielectric;

depositing a first titanium nitride layer over the work function layer, wherein the depositing the first titanium nitride layer is performed starting with a first $TiCl_4$ pulsing and purging cycle, followed by a $NH_3$ pulsing and purging cycle, wherein the depositing the first titanium nitride layer is ended with a second $TiCl_4$ pulsing and purging cycle, and wherein the second $TiCl_4$ pulsing and purging cycle is performed at an elevated wafer temperature, and is free from plasma;

soaking the first titanium nitride layer in a silicon-containing gas to form a silicon-containing layer;

exposing the silicon-containing layer to oxygen to convert a portion of the silicon-containing layer into a silicon oxide containing layer, wherein the exposing the silicon-containing layer to oxygen is performed at a room temperature;

forming a second titanium nitride layer over the silicon oxide containing layer; and forming a metal-filling region over the second titanium nitride layer.

16. The method of claim 15, wherein the depositing the first titanium nitride layer comprises a plurality of processes comprising pulsing $TiCl_4$, purging $TiCl_4$, pulsing $NH_3$, and purging $NH_3$.

17. The method of claim 15, wherein the second $TiCl_4$ pulsing and purging cycle is performed at the elevated wafer temperature in a range between about 400° C. and about 600° C.

18. The method of claim 15, wherein the exposing the silicon-containing layer to oxygen comprises exposing the silicon-containing layer to air.

19. The method of claim 15, wherein the silicon-containing gas is selected from the group consisting of $SiH_4$, $Si_2H_6$, Dichlorosilane (DCS), and combinations thereof.

* * * * *